(12) United States Patent
Akita

(10) Patent No.: US 6,922,319 B2
(45) Date of Patent: Jul. 26, 2005

(54) ADAPTIVELY CONTROLLED CIRCUIT

(75) Inventor: Shin-Ichi Akita, Tokyo (JP)

(73) Assignee: Nanopower Solutions, Inc., Tokyo (JP)

( * ) Notice: Subject to any disclaimer, the term of this patent is extended or adjusted under 35 U.S.C. 154(b) by 261 days.

(21) Appl. No.: 10/113,886

(22) Filed: Mar. 29, 2002

(65) Prior Publication Data

US 2003/0184927 A1 Oct. 2, 2003

(30) Foreign Application Priority Data

Apr. 19, 2001 (JP) .................................. 2001-121420

(51) Int. Cl.[7] .............................................. H02H 3/20
(52) U.S. Cl. ........................................ 361/79; 361/90
(58) Field of Search ............................. 361/30, 31, 33, 361/57, 79, 86, 87, 90, 91, 93.9; 330/253, 261

(56) References Cited

U.S. PATENT DOCUMENTS

| | | | |
|---|---|---|---|
| 3,702,913 A | 11/1972 | Kazluaskas et al. | |
| 4,647,798 A | 3/1987 | Crafts et al. | |
| 5,361,041 A | * 11/1994 | Lish | .......................... 330/255 |
| 5,467,048 A | 11/1995 | Watanabe | |
| 5,471,171 A | * 11/1995 | Itakura et al. | .............. 330/253 |
| 6,215,357 B1 | * 4/2001 | Sakurai | ....................... 330/255 |
| 6,404,677 B2 | * 6/2002 | Lee | .......................... 365/185.2 |
| 6,600,483 B1 | * 7/2003 | Akita et al. | .................. 345/204 |

OTHER PUBLICATIONS

Alan B. Grebene, "Bipoler and MOS Analog Integrated Circuit Design" 1984, p. 291, John Wiley and Sons, Inc.
Johns, et al., "Analog Integrated Circuit Design" 1997, p. 169, John Wiley and Sons, Inc.

* cited by examiner

*Primary Examiner*—Brian Sircus
*Assistant Examiner*—Danny Nguyen
(74) *Attorney, Agent, or Firm*—Hogan & Hartson, LLP

(57) ABSTRACT

Adaptively controlled circuits are provided that can include an output buffer circuit, a sensing circuit, and a current conversion circuit. The output buffer circuit can include, for example, inputs, outputs and a bias control input. The sensing circuit can also include inputs and outputs. Two or more sensing circuit outputs can simultaneously turn to lower or higher level than a predetermined threshold level. The current conversion circuit can be composed of one or more set of cascaded transistors. Inputs of the cascaded transistors can be connected to outputs of the sensing circuit. The output of the cascaded transistors can be connected to foresaid bias control input of the output buffer. An output current of the current conversion circuit increases when signal level of the inputs of the sensing circuit become equal or close to each other.

4 Claims, 25 Drawing Sheets

_US 6,922,319 B2_

ADAPTIVELY CONTROLLED CIRCUIT

BACKGROUND OF THE INVENTION

The present invention relates to an adaptive biasing voltage comparator circuit that compares two or more input signals to judge and output the evaluated results.

DESCRIPTION OF THE RELATED ART

Not only handy equipment but also every kind of electric equipment incorporates a voltage comparator circuit applied for low voltage detection or battery charge-discharge control. It is assumed that a few billion of such equipments are in use worldwide, If one comparator circuit draws 10 $\mu$A for example, the total idling current is multiplied by 10 billion sets and 10,000 ampere is given. If an operation voltage is assumed at 5 volt, the total power consumption reaches 50 KILO-watt what is equivalent to one power plant capacity. The present invention will reduce current consumption of a voltage comparator circuit drastically to contribute to energy saving on a global scale.

DESCRIPTION OF THE PRIOR ART

FIG. 11 shows a conventional prior differential circuit diagram applied for voltage comparator circuit. A differential circuit 10 is composed of MP1, MP2, MP3, MN2 and MN3, a buffer circuit 20 is composed of MP5 and MN5. A reference voltage level is fed to the Vref input terminal of the voltage comparator circuit. FIG. 13 shows another prior differential circuit diagram. A differential circuit 10 consists of MP1, MP2, MP3, MN2 and MN3 in the same as in FIG. 11. A buffer circuit 21 is composed of MN4, MP4, MN5 and MP5 that forms a current mirror circuit of trans-conductance amplifier and a bias current is not fixed but modified depending upon an output of differential circuit. FIG. 12 shows simulated operation waveforms of the prior differential circuits in FIG. 11 and FIG. 13. When the input signal P is lower or higher than reference input Vref sufficiently, idling current. The relationship between the idling current and rise-fall time or transition time can be derived from the charge equation Q=CV roughly. As shown if FIG. 11, Id stands for the drain current of MP2; Vg for the voltage transition of OUTX; dT1 for the transition time of Vg; Ig for the charge of discharge current of Cg during dT1, then equation (1) is given as, $$Ig*dT1=Cg*Vg \qquad (1)$$

Since Ig is a breeding current of Id, the value is supposed as ⅕ to 1/20 generally. The breeding factor stands for K, $$Ig=Id/K$$

Only a part of dT1 contributes to the delay time of output OUTX, it is assumed that around b0% of dT1 transformed to the delay time by evaluation from the relation between the threshold voltage and supply voltage.

$$T1=0.8*dT1=0.8*K*(Cg*Vg)/Id$$

The transition time of OUTX stands for dT2; Ic for idling current of MP5; all of Id flows into CL when MN5 is off state, then following equation is derived.

$$dT2=(CL*Vdd)/Ic$$

The delay time T2 is measured at the half position of supply voltage, then $$T2=0.5*dT2$$

A required delay specification stands for Tos, $$Tos<T1+T2$$

$$Id>K*Cg*Vg/T1 \qquad (2)$$

$$Ic>0.5*CT*Vdd/T2 \qquad (3)$$

At the fall transition the load capacitor CL is discharged through MN5 and idling current of MP5 does not contribute to transition time.

The addling current of the whole circuit stands for Ii, $$Ii=2*Id+Ic \qquad (5)$$

The drain current _Id_ is multiplied with 2 because Id is the idling current of one side of differential circuit.

For the example, T1<20 $\mu$S, T2<5 $\mu$S, Cg=0.1 pF, CL=5 pF, Vg=2V, Vdd-3V, K=20, $$Ii>1.98 \mu A$$

In case of, T1<5 $\mu$S and T2<2 $\mu$S $$Ii>6.15 \mu A$$

In this way, the minimum idling current can be evaluated by a required specification for output delay time.

FIG. 12 shows stimulated waveforms when the input P is risen slowly from VSS level to VDD level and then falls down to VSS level again. Even though the transition is very slow as few hundreds hours in an actual voltage detector application, the stimulation time scale is accelerated for easy observation. _qo_ indicates the output waveform of prior comparator circuit when the bias current is designed to meet the required rise time less than 10 $\mu$S. _qo2_ and _qo3_ indicate the output waveforms of prior circuit shown if FIG. 11 and FIG. 13 respectively in which the bias current is limited below 100 nA.

In the prior art, the idling current cannot be reduced from the certain limitation decided by a required transition delay time of output. If it is set to lower current than the limitation, the transition delay time becomes very large and that will result in application problems. The order of microampere looks like negligible small in the aspect of total system current consumption, however the accumulated amount becomes huge value because multi-billion of equipments are in work on the global scale. It should be noted that reducing the idling current of a voltage comparator circuit incorporated in all of electric equipments is a significant subject for global energy saving.

SUMMARY OF THE INVENTION

As described previously, it is impossible to reduce the idling current by means of prior circuit and design methodology such as the circuits if FIG. 11 and FIG. 13. The presented invention provides a means composing of small count of transistors and a design methodology proofed sufficiently by a formula well correlated with measure results.

To solve the above problems, a new circuit configuration and a new design theory is proposed, in which the idling current can be designed on the order of NANO-ampere when the inputs are far away from a detective reference level, and only at the detection transition the operation current becomes required level to attain a specified transition delay time. It is well known that output transition time of the voltage comparator circuit relates to operation current. Therefore it is presumable that boosted operation current only at the detection transition will realize low power and high-speed circuit, however no prior proposal attains the goal with less transistor count and simple design theory. The invention presented that a new means and a method realize the current boost only at the output transition, by a combination of cascaded transistor architecture and conventional differential circuits of which transistor pairs are designed under a new theory.

DETAILED DESCRIPTION

Figure 1:
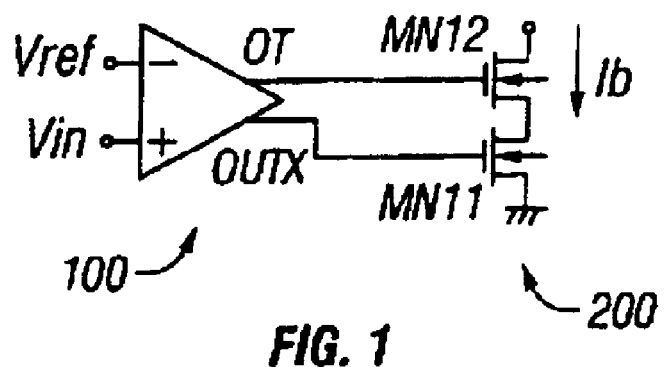
FIG. 1, FIG. 3 and FIG. 5 are circuit diagrams explaining a principle of the presented invention.
Figure 3:
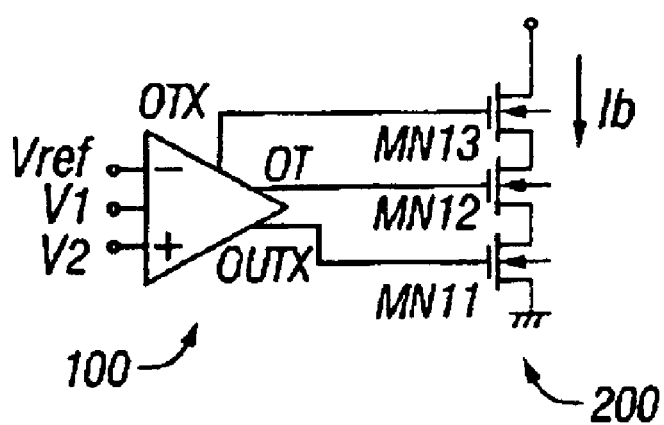
Figure 5:
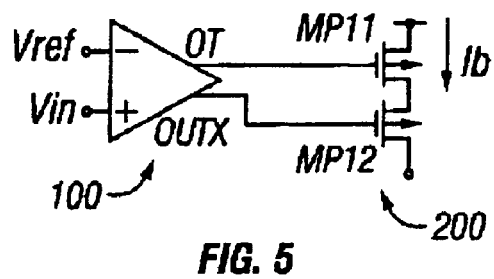

FIG. 1, FIG. 3 and FIG. 5 are circuit diagrams explaining a principle of the presented invention. MN11, MN12 and MN13 are N-FET forming a conversion circuit 200, which converts a voltage signal or a current signal to a bias current.

Figure 2:
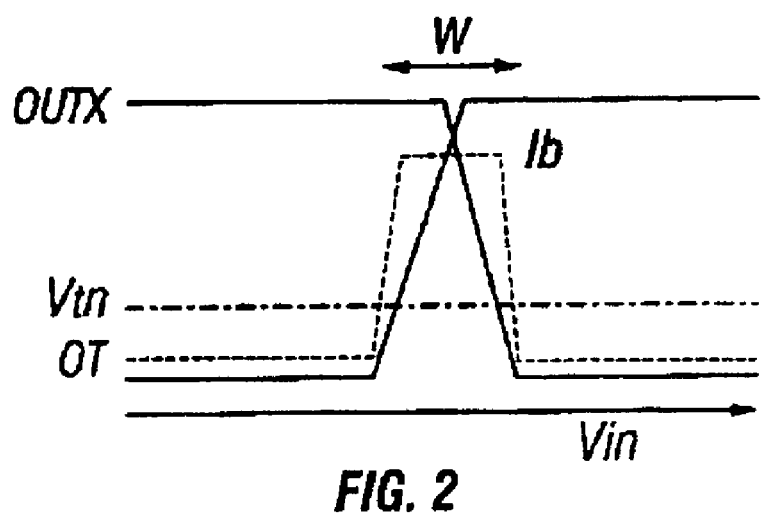
FIG. 2, FIG. 4 and FIG. 6 are transfer characteristics of the circuits shown if FIG. 1, FIG. 3 and FIG. 5 respectively.

Vref is a reference voltage input and Vin is a signal input. In case of Vin<Vref, the output OT is low level, therefore MN12 is at off-state. In case of Vin>Vref, the output OUTX is low level than MN11 is cutting off. As shown in FIG. 2 that is transfer characteristics of FIG. 1, when the both of output OT and OUTX are higher than the threshold voltage Vtn of N-FET MN11 and MN12, the transistors MN11 and MN12 can draw bias current Ib. Hereinafter this current is named as a conversion current. During the input Vin being close to Vref and the conversion current being flowing, the voltage range of the input Vin stands for a sensing window as shown FIG. 2. It becomes possible to increase the operation current only at the output transition that caused by cross over of two inputs, if the bias current of differential circuit would be boosted by feedback of the conversion current.

Figure 4:
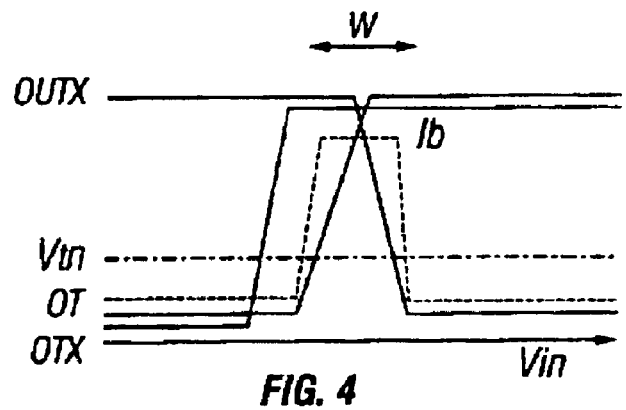

FIG. 3 shows a case of three inputs. For instance Vref and V1 has same relation in Vref and Vin shown in FIG. 1, V2 is assumed as an extra-condition. When the status of V2 meets some condition, V1 and Vref control the conversion current as shown FIG. 4.

FIG. 5 is a block diagrams explaining a principle of the presented invention utilizing P-FET. A sensing circuit denoted by 100, the conversion circuit 200 is composed of MP11 and MP12, converts a voltage signal or a current signal to the conversion current.

Figure 6:
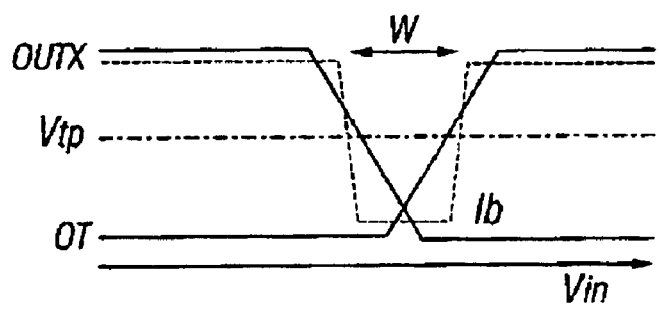

Analogical to FIG. 6, both of the output OT and OUTX are lower than the threshold voltage Vpt of P-FET, the transistor MP11 and MP12 can draw the conversion current Ib.

Figure 7:
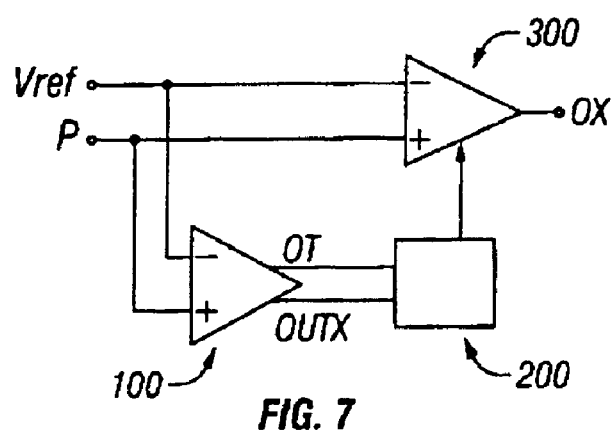
FIGS. 7, 8, 9 and 10 are block diagrams explaining the architecture of the present invention.
Figure 8:
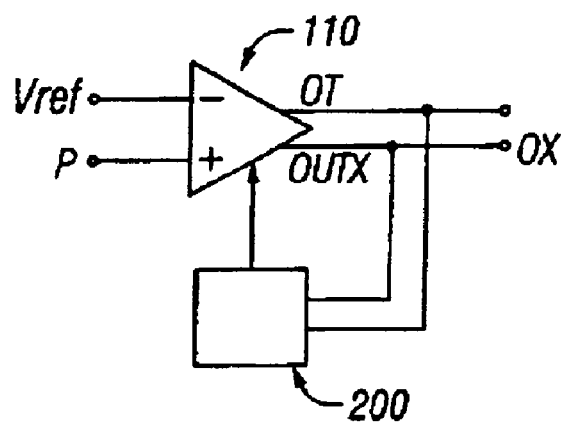
Figure 9:
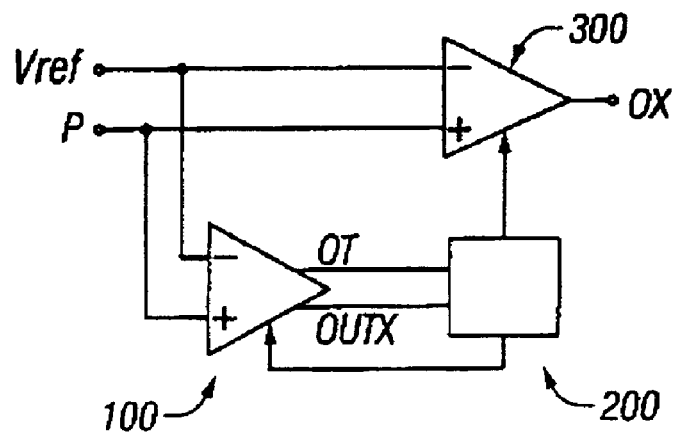
Figure 10:
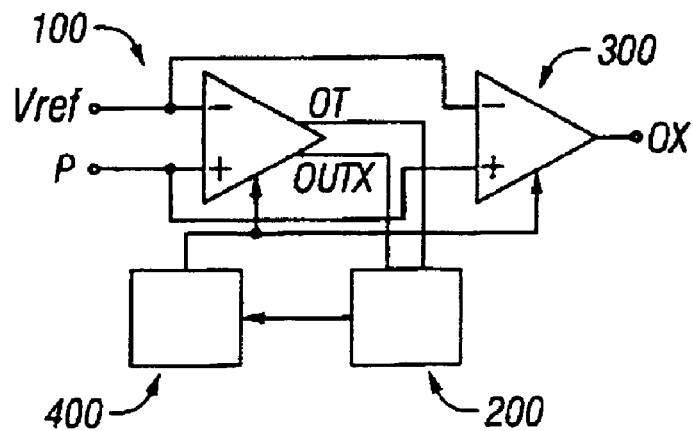

FIGS. 7, 8, 9 and 10 are block diagrams explaining the present invention. FIG. 7 is a block diagram corresponding to claim-1, consisting of a sensing circuit 100, a conversion circuit 200 and a buffer circuit 300. The voltage difference between two inputs of the sensing circuit is detected to convert for bias current which is fed back to the buffer circuit 300. FIG. 8 is a block diagram corresponding to claim-2, comprising a sensing circuit 110 and a conversion circuit 200. The differential input level of the sensing circuit is detached to convert to a bias current of the sensing circuit itself for acceleration of the output response. FIG. 9 is a block diagram corresponding to claim-3, being composed of same element as in FIG. 7, but the bias current is fed back to the sensing circuit and the buffer circuit too. FIG. 10 shows a block diagram corresponding to claim-4 being composed of a sensing circuit 100, a conversion circuit 200, a buffer circuit 300 and a bias current generation circuit 400. The converted current is fed back to the bias current generation circuit to modify the bias current for all blocks.

Figure 11:
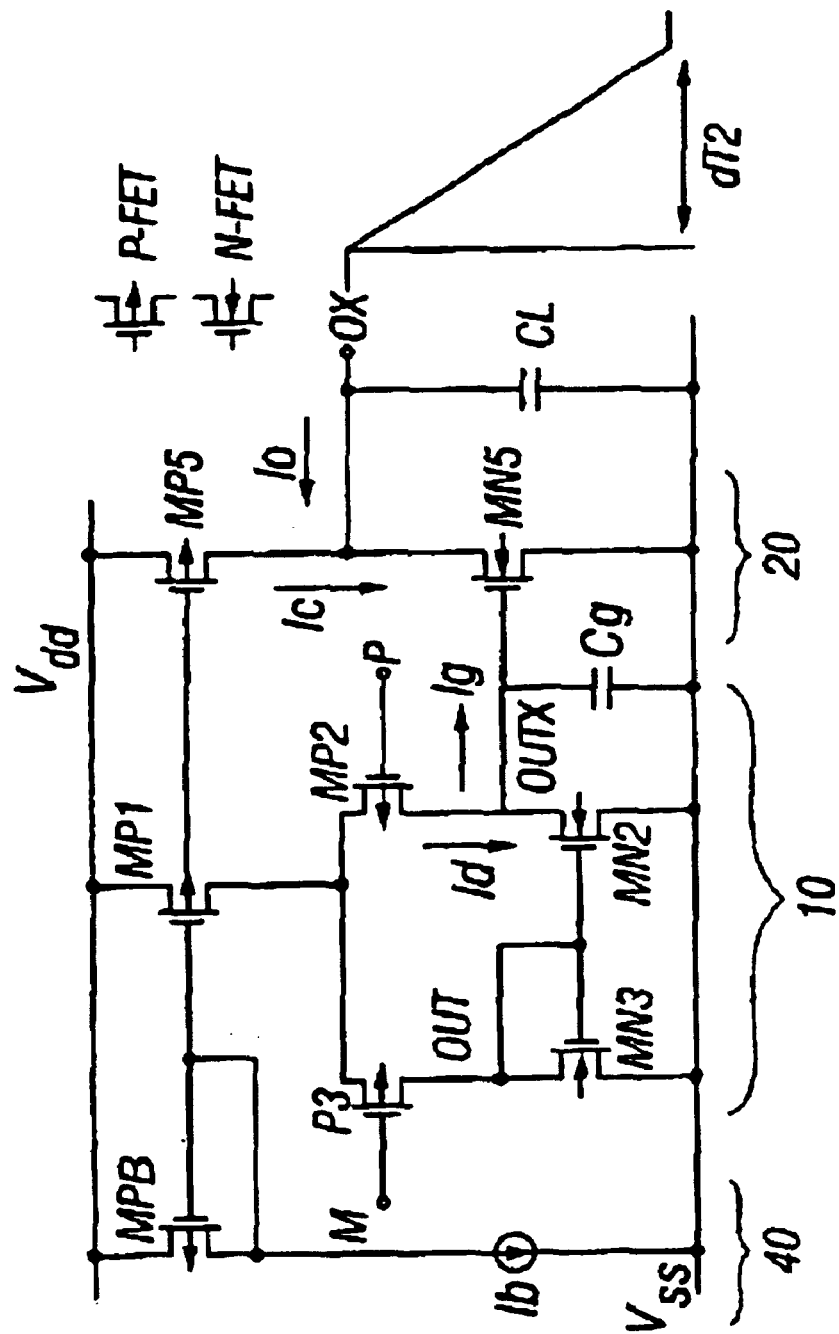
FIG. 11 is a circuit diagram of conventional prior differential amplifier applied for voltage comparator.
Figure 12:
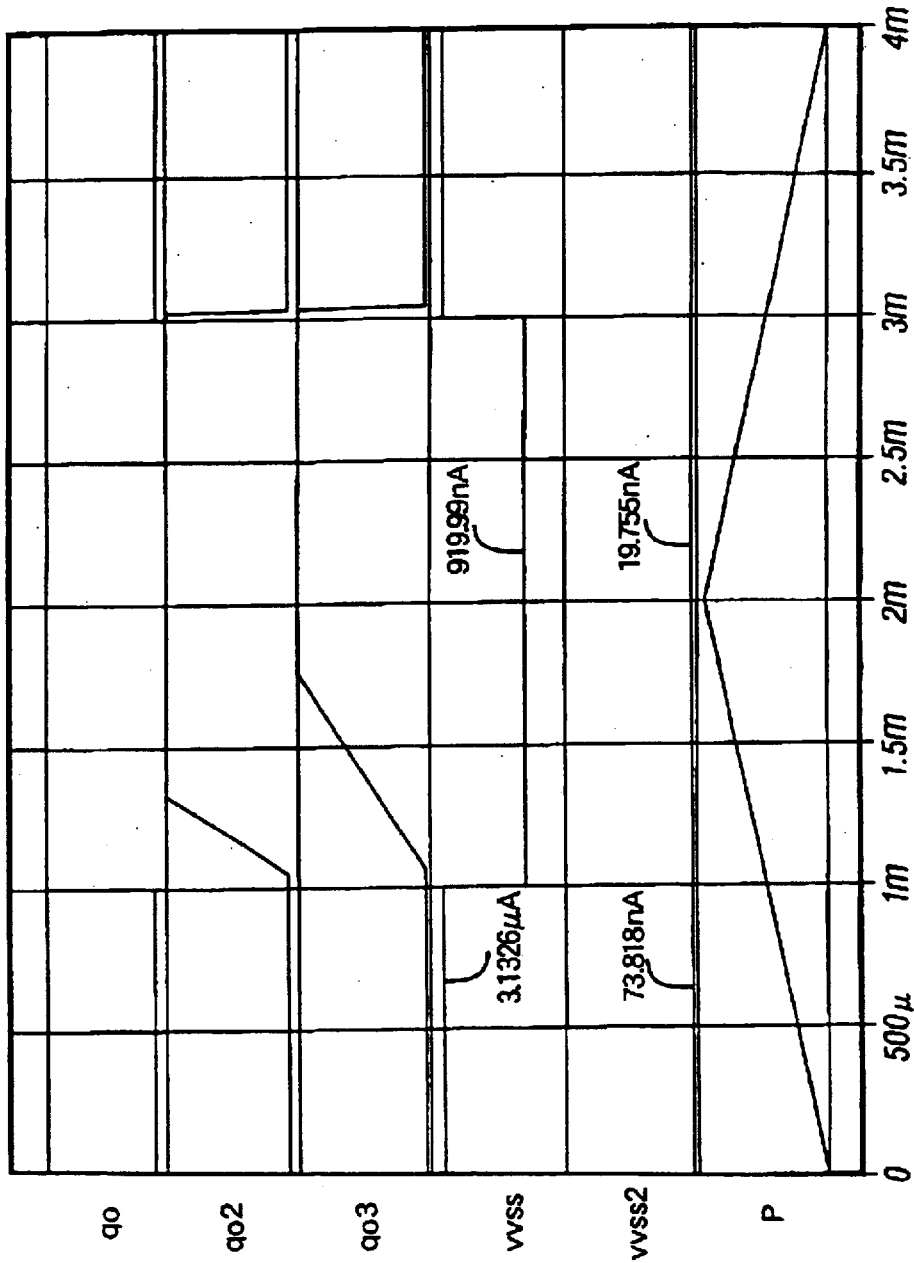
FIG. 12 is a simulation waveform diagram showing voltages and currents of respective node of the circuit showing in FIG. 11.
Figure 13:
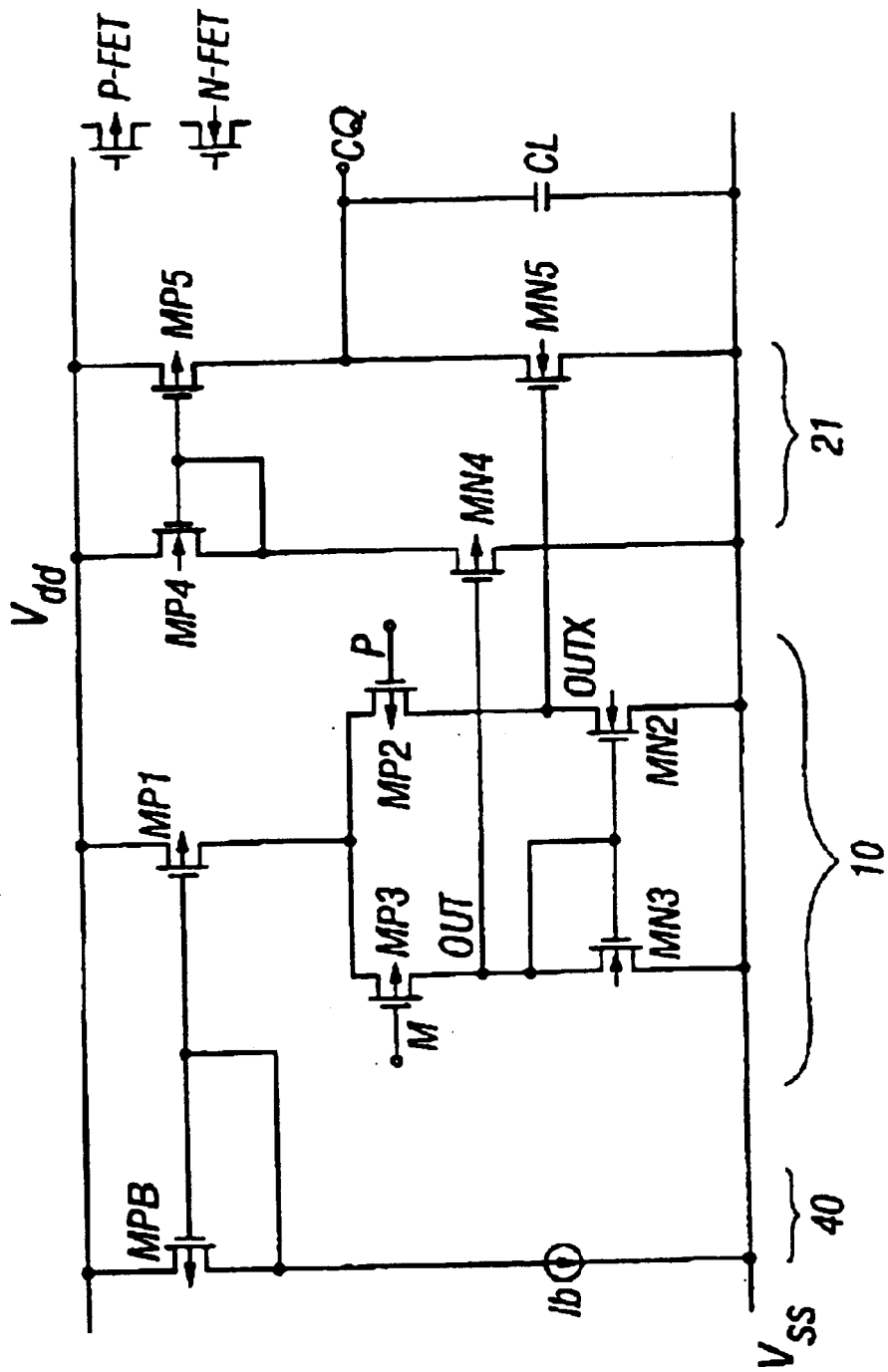
FIG. 13 is a circuit diagram of another prior differential circuit.
Figure 14:
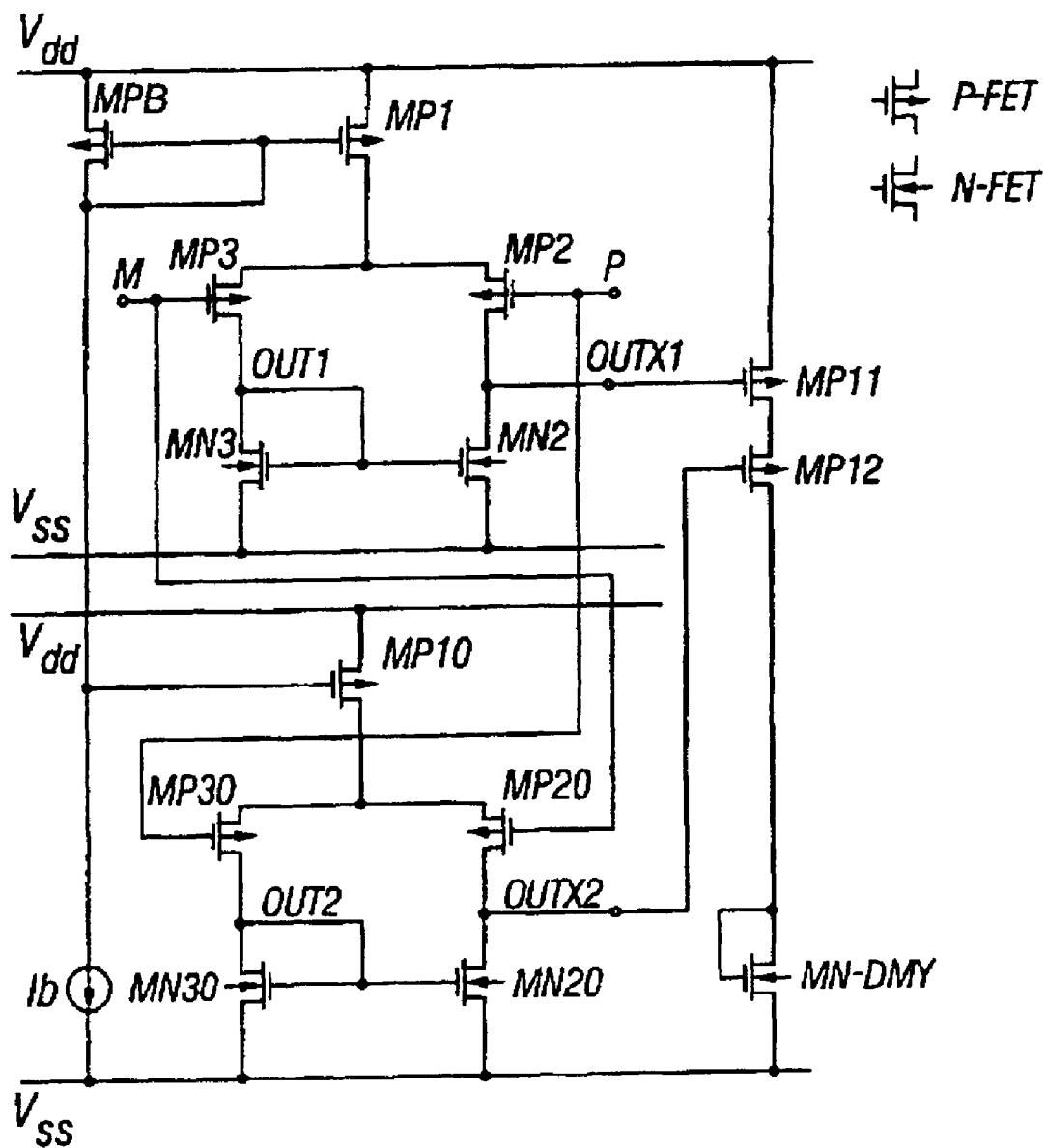
FIG. 14 is a circuit diagram in which inputs of two differential circuits are connected like cross-coupled expecting that outputs may meed with the required condition of the invention.
Figure 15:
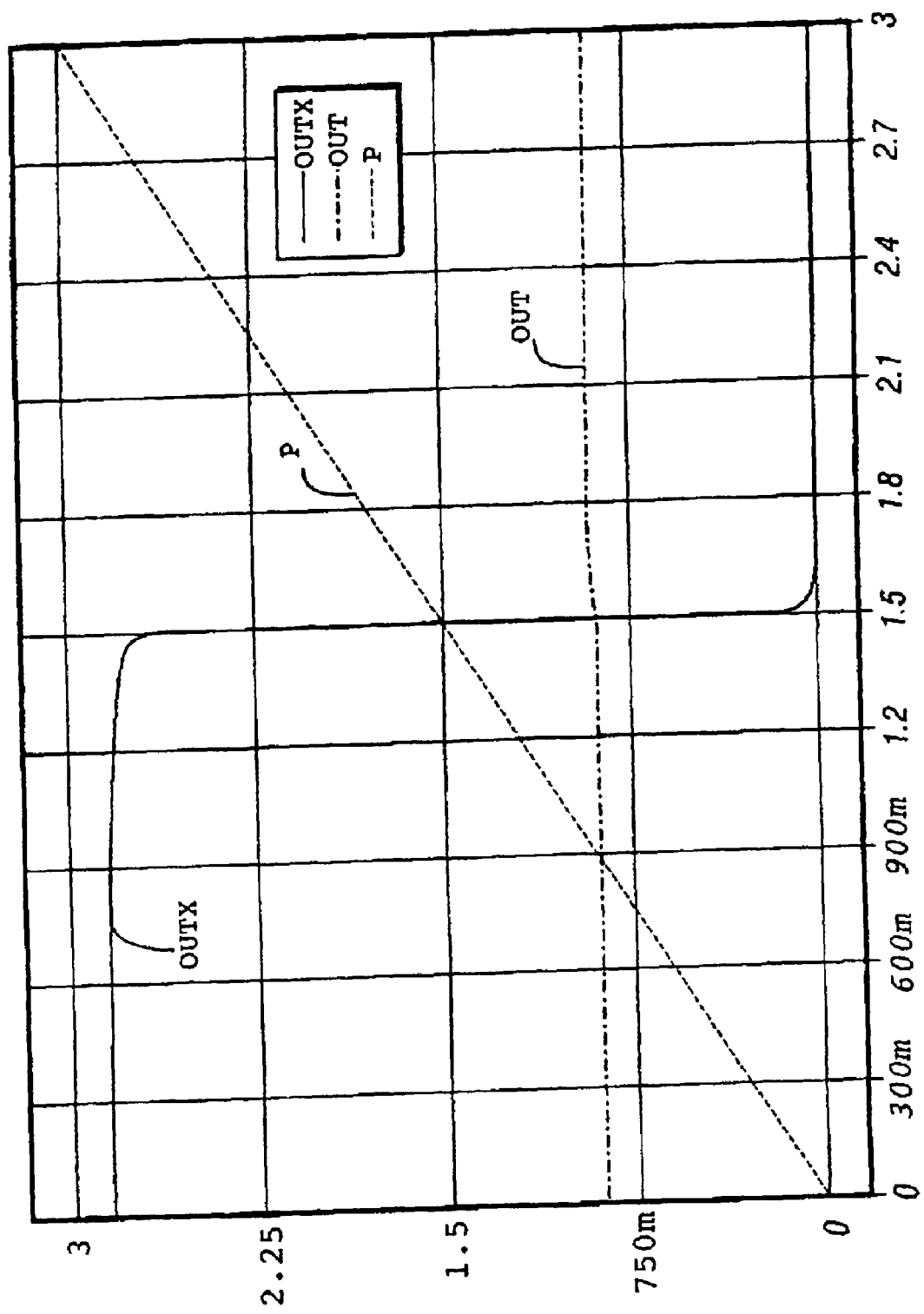
FIG. 15 is a transfer characteristic of the circuit shown in FIG. 11.

In the invention, one of significant claimed circuit is a sensing circuit of which outputs turn to lower or higher than a predetermined threshold voltage at the same time. FIG. 15 shows transfer curve between input and output of the prior differential circuit shown in FIG. 11. The transfer curve of the outputs OUT and OUTX are measured under the condition of fixed Vref level and gradually changed P input, two outputs do not meet with the required condition of the invention. Since the output OUT does not change so much and only OUTX swings. FIG. 14 shows a circuit diagram in which inputs of two differential circuits are connected like cross-coupled expecting that outputs may meet with the required condition of the invention. The cross-coupled differential circuit is connected with a conversion circuit claimed in the invention. The transfer characteristics is shown if FIG. 16, and the both of two outputs OUTX1 and OUTX2 are lower than the threshold voltage of P-FET to draw a current through MP10 and MP11. However the width said previously as the sensing window is only 2 mV that is not applicable for mass-production because any conventional differential circuit has several mV of output offset inevitably.

Figure 16:
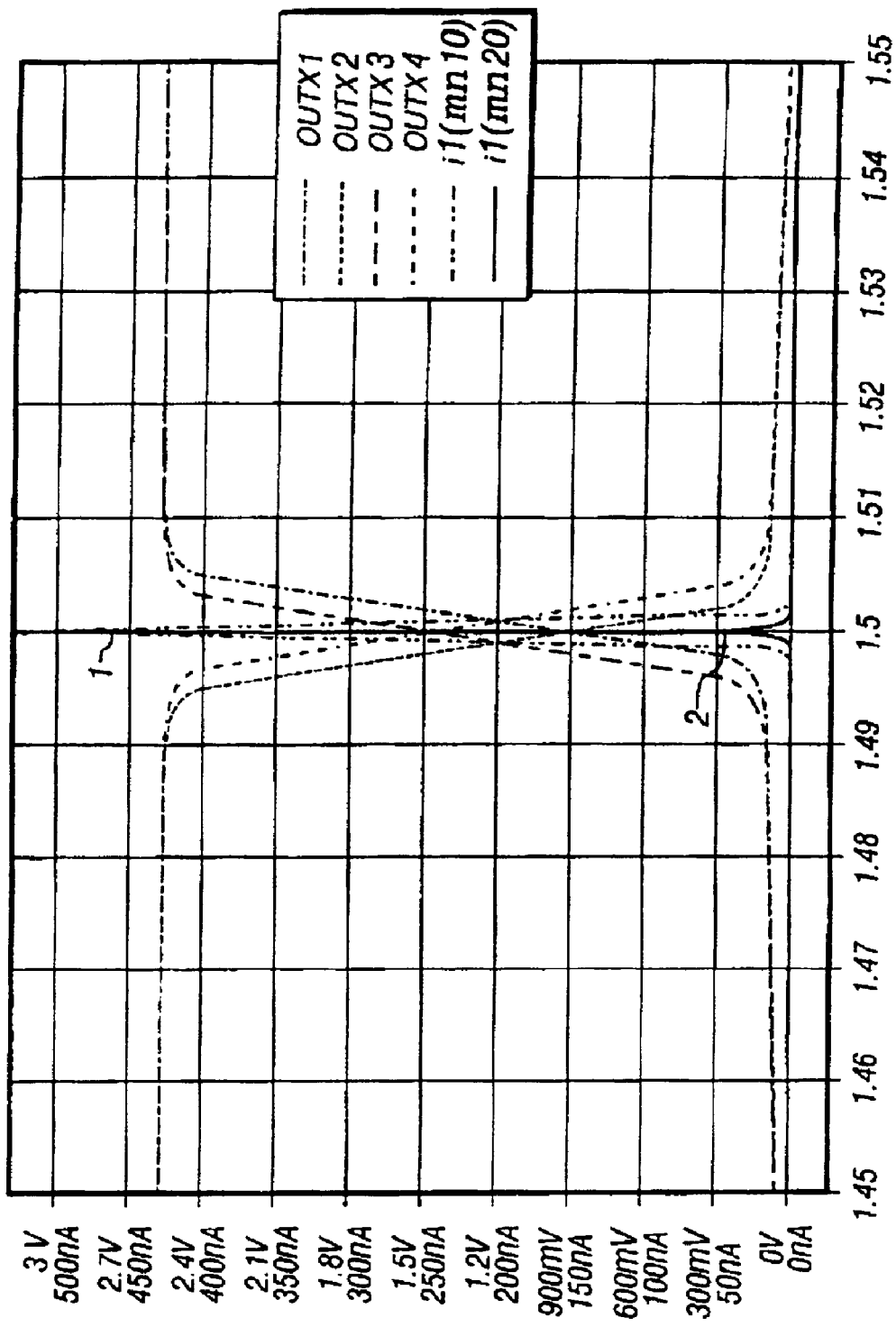
FIG. 16 is a transfer characteristic of the circuit shown in FIG. 14, indicating that both of two outputs OUTX1 and OUTX2 are lower than the threshold voltage of PFET to draw current through MP10 and MP11.

For example the curve 2 shown in FIG. 16 indicates a conversion current when just 1 mV of offset appears at the outputs, and it shows that the current of MP10 is very small and narrow because the two outputs are turning lower than the threshold Vtp in a very narrow window. In other words the sensing window by means of prior art may disappear very easily due to just a little deviation on the production process. To solve this problem many proposals were presented, for instance, two different reference voltages are fed to differential circuit to generate fairly wide sensing window and the contribute to flowing stable conversion current. It is called as a window comparator and various types were proposed like U.S. Pat. No. 4,160,175, U.S. Pat. No. 6,127b54 and U.S. Pat. No. 6,064,240. But all of them needed many addition parts and current flow through them, were not suitable for integration on a semiconductor or a grass wafer and as a result did meet with the requirement of drastic low power.

As described above the prior design theory and circuits do not meet with the goals of the invention that are less component and very low idling current and stable productively with easiness and enough margin.

Embodyment

Figure 17:
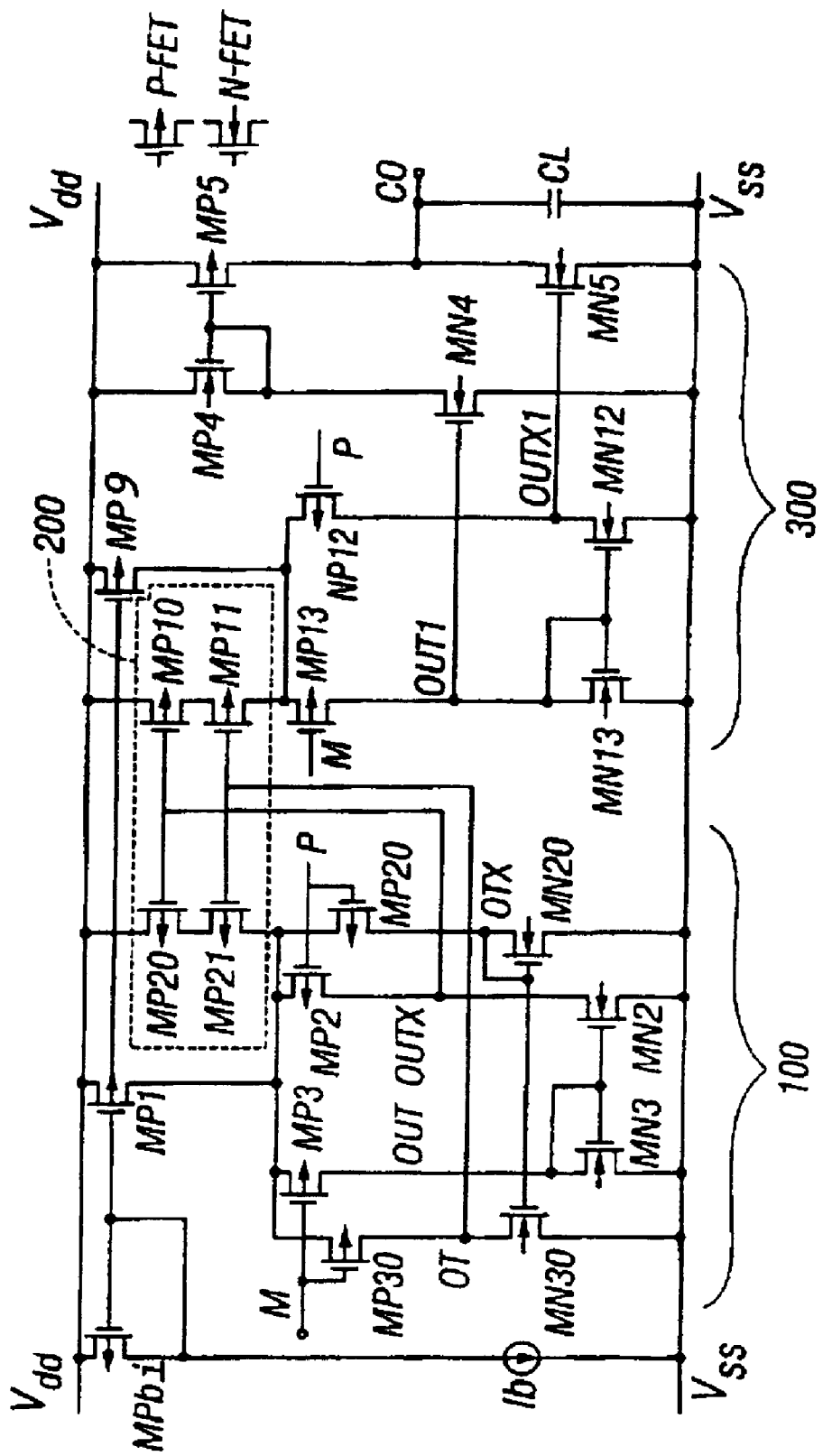
FIG. 17 is a circuit diagram showing a first embodiment of the present invention.

FIG. 17 shows the first embodiment of the invention corresponding to the claim-3 and claim-5. A numeral 100 denotes the sensing circuit. One differential pair comprising MP2, MP3, MN2 and MN3, and 2nd differential pair comprising MP20, MP30, MN20 and MN30 are connected to a common current source. This differential configuration is cited in U.S. Pat. No. 4,728,900 and U.S. Pat. No. 5,491,455 with a differential intention from the presented invention. It has a feature that two of outputs have reversed phase. Still it is not applicable for a sensing circuit so as to get enough width of the sensing window because of same reason as FIG. 14 mentioned previously. If it is designed under a theory of prior art, MN2 and MN3 and MN20 and MN30 should have the same transistor size; the transfer characteristic is equal to as of FIG. 16. While the output signal OT and OUTX are in reversed phase, and there is a area where both of the output signal OT and OUTX are lower than a threshold voltage Vtp, transistors MP10, MP11, MP20 and MP21 of a conversion circuit can conduct a current only in few mV of the P input range. The sensing window must have sufficient width so as to absorb the deviation of a fabrication process and cover the input signal transition speed. In a word when the sensing window is too narrow the changing input passes away before the sensing circuit reacts to trigger the converting circuit for increasing the bias current. Vc (Volt/Second) stands for the input transition speed, W (Volt) for the width of sensing window, T (Second) for the response time of sensing circuit and conversion circuit, a following equation is given.

$$W > Vc*T \tag{10}$$

When the transition speed Vc becomes larger, the sensing window must be wider. In the respect, a new design methodology becomes necessary to be established. The present invention provides how to solve it According to the prior design theory; each of transistors or a differential pair must have a same size or a same conductance. Therefore a new design principle becomes necessary to be established for controlling the width of sensing window freely. A theory of relationship between the width of sensing window and size of transistors is studied.

When the size of transistor pair MN2 and MN3 is identical and the input P equals to the input M, MN2 and MN3 pass the same current and both of the drain voltage are balanced, and the P input and the M input is at around Vdd/2, the current equation in saturation region can be applied because the node voltage meet the condition Vd>Vg−Vt.

$$Id=0.5*Gm*(Vg-Vt)E2(1+r*Vds) \tag{12}$$

Figure 19:
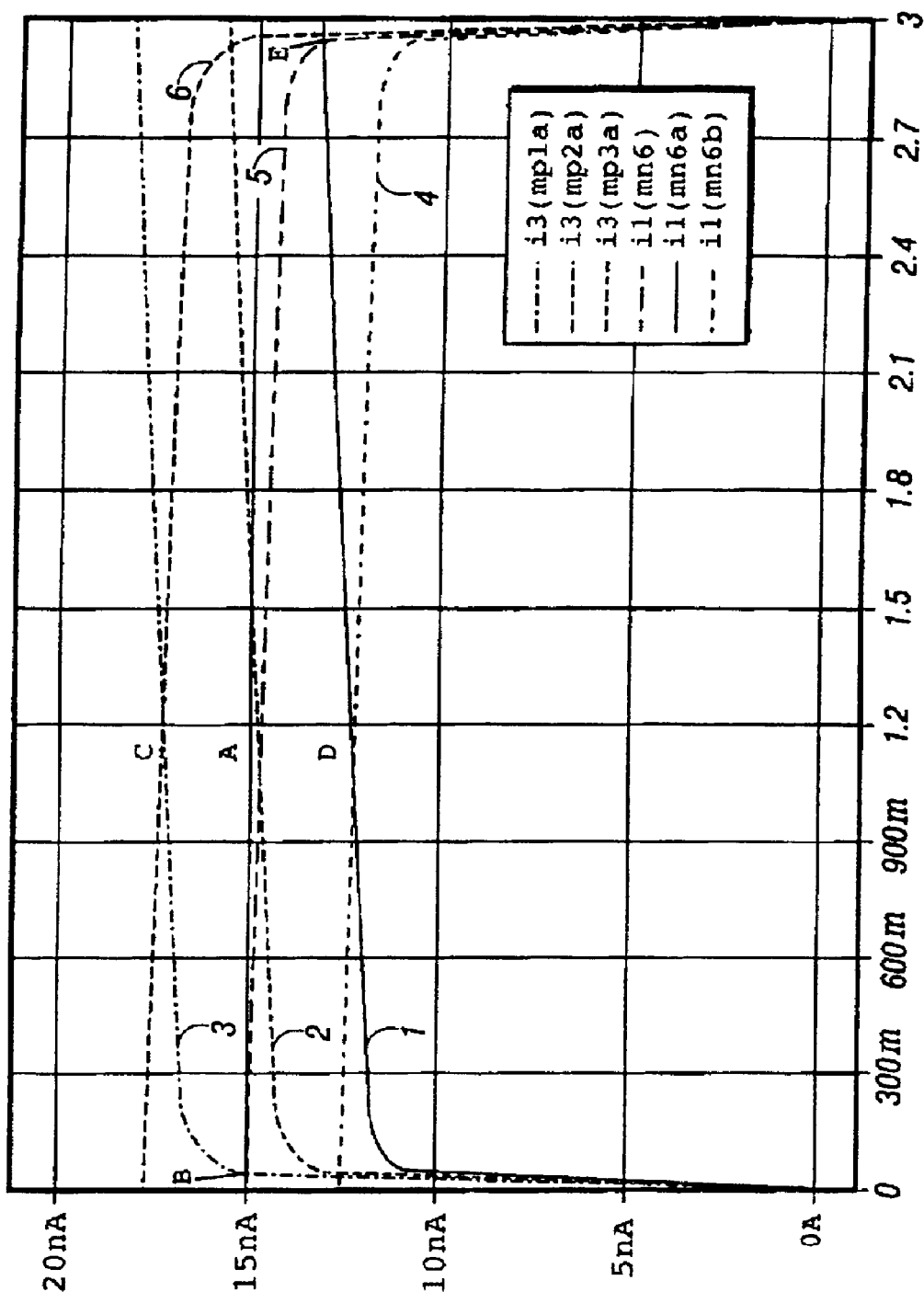
FIG. 19 shows transfer characteristics of MN2 and MP2 in FIG. 17 for explaining how to widen a sensing window of the sensing circuit.

FIG. 19 shows the characteristics between drain voltage vs drain current of MN2 and MP2. The number 1, 2 and 3 show current curves of MN2. The curve 3 shows larger size, the curve 1 shows smaller size. The curve 4, 5 and 6 show characteristics of MP3 and corresponding to Vg=2.2V, Vg=2.21V and Vg=2.22 respectively. The cross point of curve 2 and curve 5 denoted as A indicates operation point of MN2 and MP2 that is equal to the drain voltage or the output voltage OUTX. When the size of MN2 is enlarged, the drain current curve is shifted from the curve 2 to the curve 3, and then the operation point moves from the point A to the point denoted as B. In case of smaller size the drain current curve is replaced from the curve 2 to the curve 1, and then the operation point moves to the point denoted as E. In FIG. 19, the point denoted C indicates the operation point for larger size that has the same drain voltage as point A. The point denoted D indicates an operation point for smaller size that has the same drain voltage as the point A.

For larger transistor size, the P input must be dropped in order to return the operation point from B to C that has the same output voltage as A. Id0 and Id1 stand for the drain current of MP2 before and after the size change of MN2 respectively, Vg0 and Vg1 for the gate voltages, the conductance for Gmp, the threshold voltage for Vtp:

$$Vg0=\{SQR(Id0/0.5*Gmp)+Vtp\}/SQR(1+r*Vds0) \tag{13}$$

$$Vg1=\{SQR(Id1/0.5*Gmp)+Vtp\}/SQR(1+r*Vds1) \tag{14}$$

$$\begin{aligned}dVg &= Vg1 - Vg0 \\ &= SQR(Id1/0.5*Gmp*L1) - SQR(Id0/0.5*Gmp*L0)\end{aligned} \tag{15}$$

Where L1=1+r*Vds1 and L0=1+r*Vds0.

dVg is the drifted inverting threshold voltage of the P input caused by the size change.

The equation (15) tells that dVg becomes minus or plus values depending on Id0 and Id1, and that shows that OUTX and OT can be overlapped in both of high side and low side.

As a result, both of N-type transistor and P-type transistor can be used for the conversion circuit, which provides high flexibility in design a circuit.

As mentioned above, it becomes possible to optimize the width of sensing window even in a prior circuit by applying the new design theory that is invented with different point of view. For the beginning a differential amplifier is studied and presented for pursuing the improvement of the symmetry and balance nature. There is almost none case of researching for reversed direction except the U.S. Pat. No. 5,963,062 and U.S. Pat. No. 5,471,171.

Figure 18:
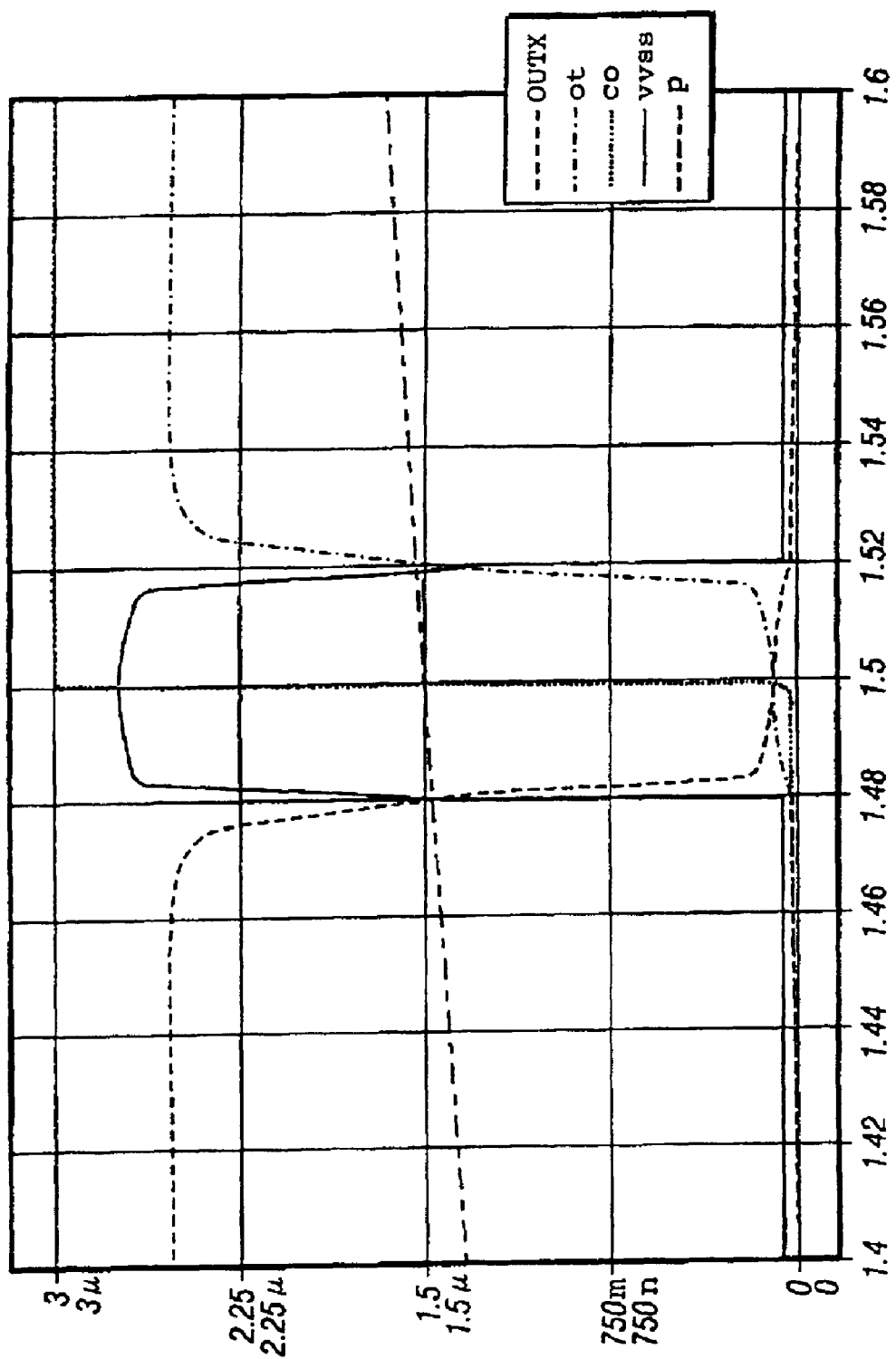
FIG. 18 is a transfer characteristic of the circuit shown in FIG. 17, indicating improved width of sensing window.

In case of FIG. 17 form the equation (15) the sensing window can be spread by the method that the sizes of MN2 and MN30 are set larger than MN3 and MN20 respectively. FIG. 18 shows an example, where the size of MN2 and MN30 is designed to 15% larger than MN3 and MN20 respectively and the sensing window becomes wider about 20 mV from 2 mV. In FIG. 18, the curve denoted outx and ox show transfer curve of output OUTX and OT respectively, and the curve denoted vvss indicates supply current at VSS terminal; The current is 2.7 $\mu$A within the sensing window of 20 mV, and 50 nA outside the sensing window. P-FET is adopted for the conversion circuit; therefore low side overlapping becomes sensing window. On the other hand, high side overlapping becomes a sensing window in case of a conversion circuit composed of N-FET, and the previously mentioned FET should be set smaller size.

According to the presented invention, a relationship between the width of a sensing window and the transition speed of input signal can be transformed to a law and which is implemented in a new design theory, by utilizing it, with a less count of components a voltage comparator circuit can be operated under very low idling current during the waiting period of an output transition that seems to be impossible to realize by means of prior art.

Figure 20:
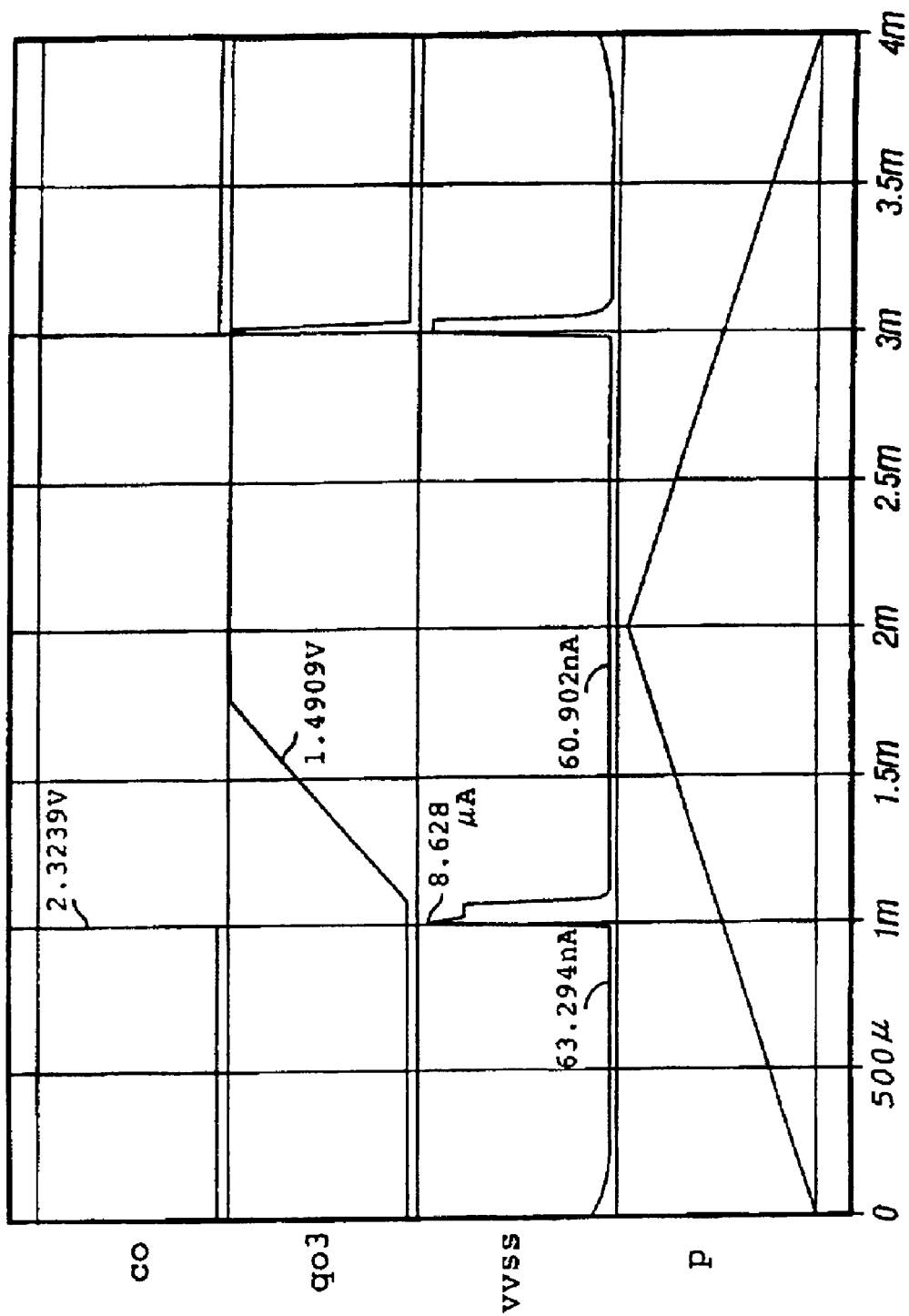
FIG. 20 is a simulation waveform diagram showing voltages and currents of respective node of the circuit showing in FIG. 17.

FIG. 20 is a simulation waveform diagram showing voltages and currents in respect to the circuit in FIG. 17. In the figure, a time scale is plotted on the horizontal axis and the number at pointing line shows that top one indicates voltage or current and middle one indicates time.

In case shown FIG. 20, VDD=3V, VSS=0V, CL=5 pF, a constant voltage as VDD/2 is fed to the M input and at the P input terminal a slowly changing triangular signal is fed.

The voltage waveform of the output terminal CO is shown by _co_, of which transition delay time if 9.2 $\mu$S. The mark _qo3_ shows the voltage waveform of the output terminal CO when the circuit in FIG. 17 has no adaptive feedback path and the transition delay time is 435.2 $\mu$S that is fairly larger number than the delay time of _co_. The supply current waveform at VSS is shown by _vvss_ and that indicates peaked current flow at the output transition only, very low current 65 nA flows during the waiting period.

Figure 21:
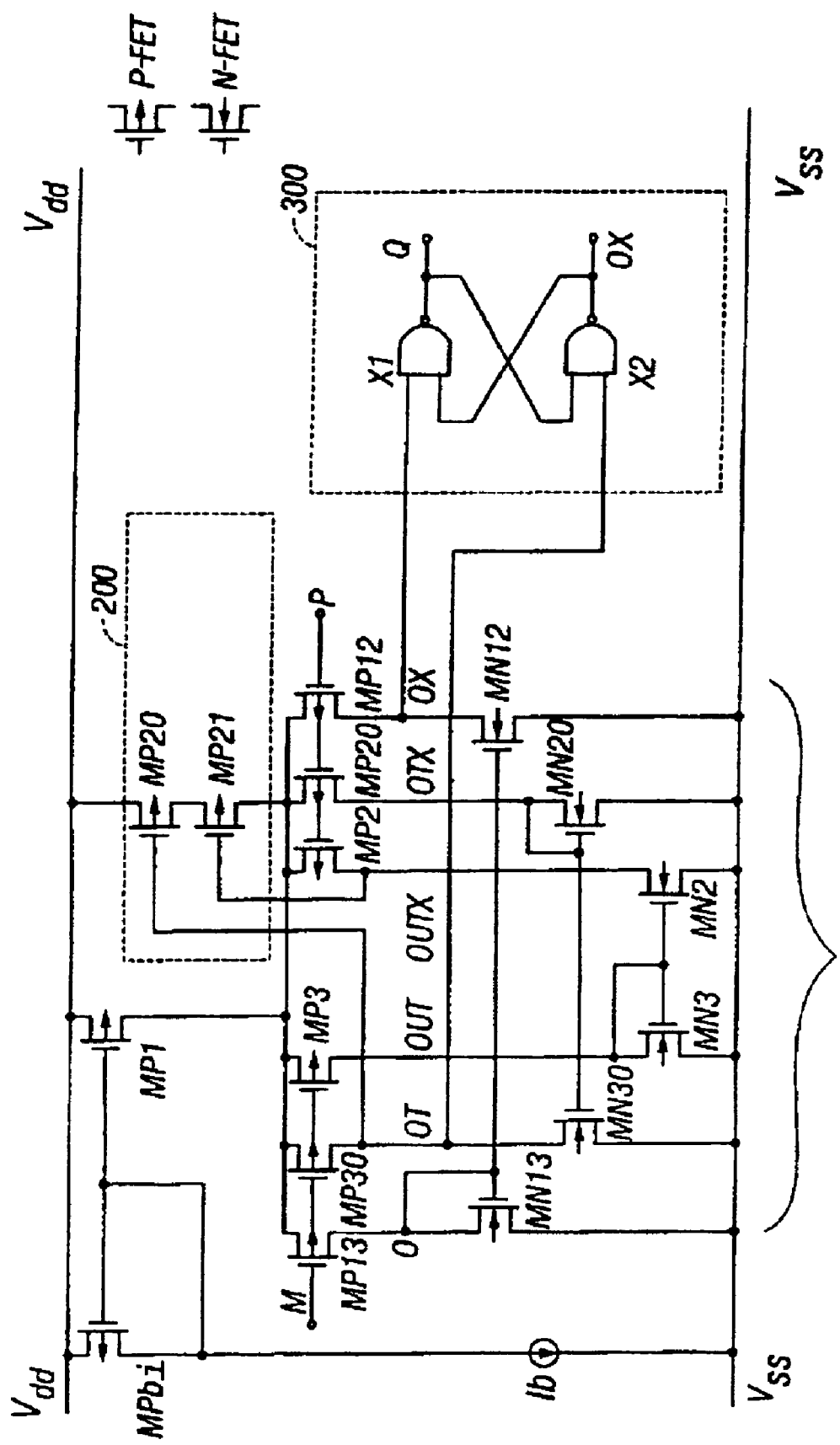
FIG. 21 is a circuit diagram showing a second embodiment of the present invention.

FIG. 21 shows a circuit diagram of the second embodiments corresponding to claim-2 and claim-5. A sensing circuit 100 is same as of FIG. 17 and the transistor MN2 and MN30 have larger size than that of MN3 and MN20 respectively. A conversion circuit 200 consists of P-FET MP10 and MP11, and a buffer circuit 200 utilizes a latch circuit. When the P input and the M input becomes close each other, a conversion current flows through the P-FET MP10 and MP11, and then a bias current of the sensing circuit is increased to be sufficient for driving a input capacitance of the next buffer circuit to fasten the transition time.

Figure 22:
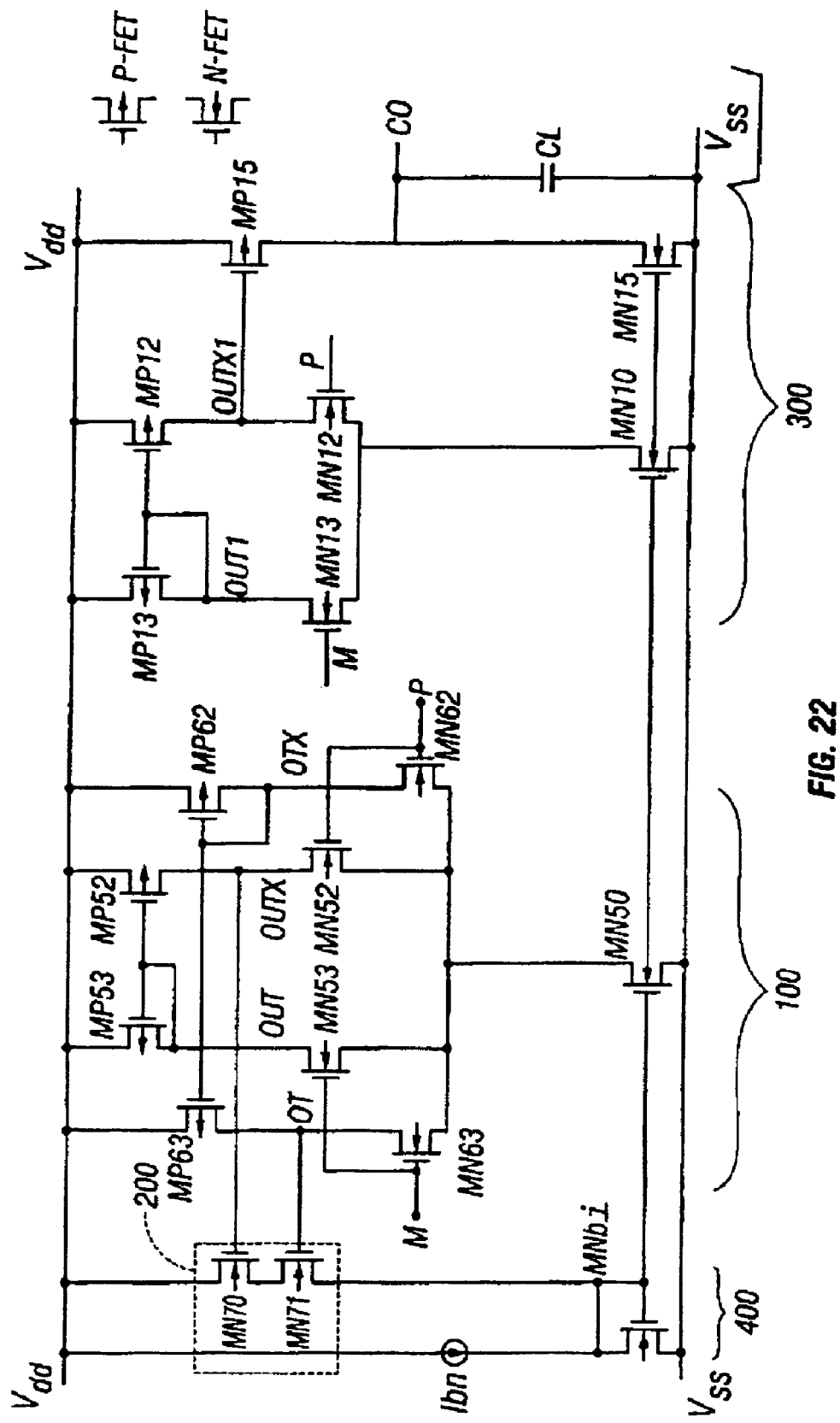
FIG. 22 is a circuit diagram showing a third embodiment of the present invention.

FIG. 22 shows a circuit diagram of the third embodiment of the invention corresponding to claim-4 and claim-5. A sensing circuit 100 utilizes N-FET input double pair differential circuits and a conversion circuit 300 applies a N-FET input differential circuit with an output driver. A bias generation circuit 400 consists of a current source ib and a mirror transistor Mbi. The transistor MP70 and MP71 conduct a bias current within the sensing window to increase the current of Mbi in the bias generation circuit, that is mirrored to MN50, MN10 and MN15 in proportion to the each transistor size ratio. Thus the operation current of the sensing circuit and the buffer circuit is increased so as to attain quick response.

Figure 23:
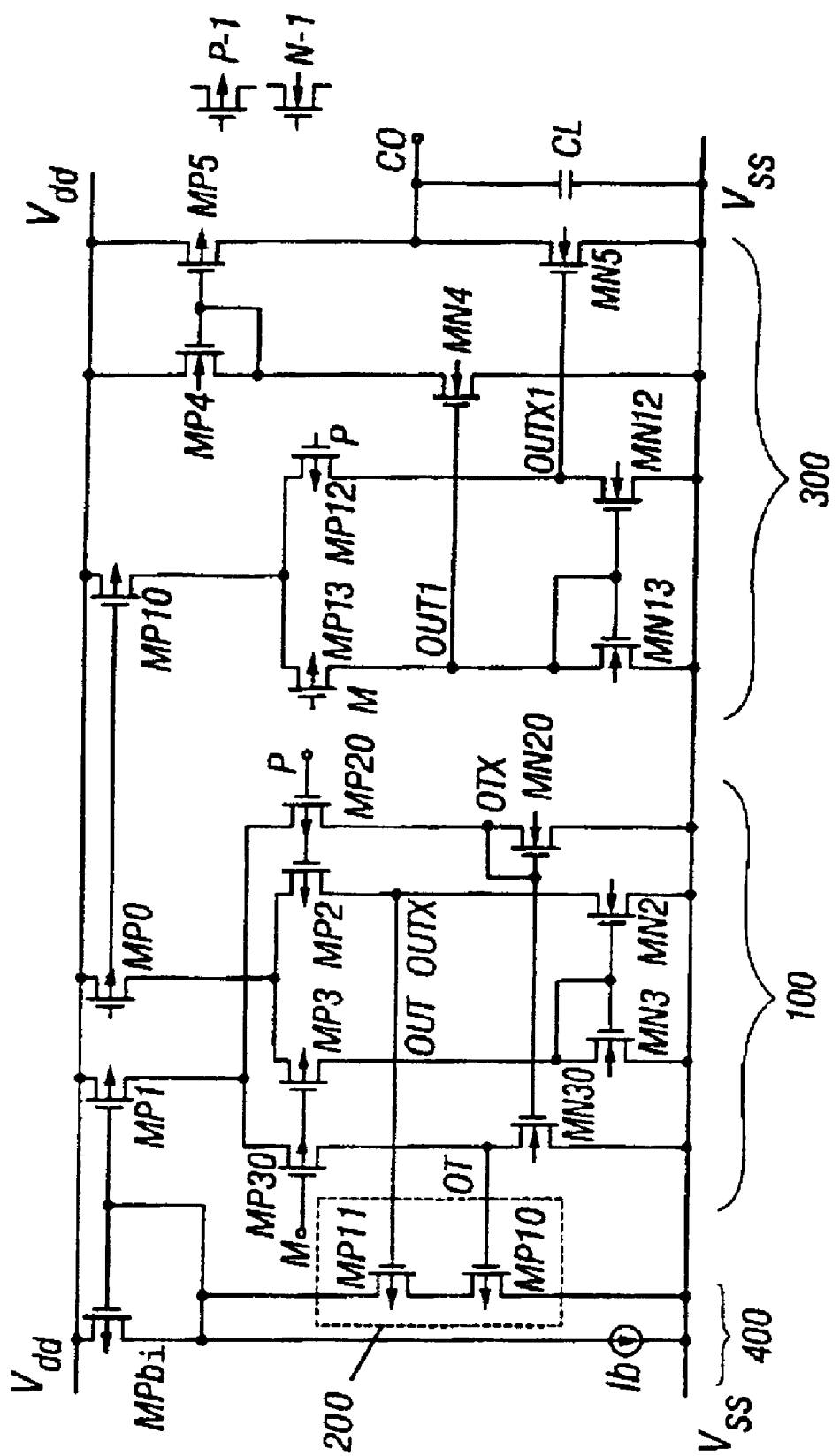
FIG. 23 is a circuit diagram showing a fourth embodiment of the present invention.

FIG. 23 shows a circuit diagram of the fourth embodiment of the invention corresponding to claim-4 and claim-5. A sensing circuit 100 utilizes dual P-FET input differential amplifiers and a conversion circuit 200 consists of P-FET MP10 and MP11, and a buffer circuit applies a P-FET input differential circuit with trans-conductance buffer.

The transistor MN2 and MN30 have larger size than that of MN3 and MN20 respectively so as to widen the sensing window. When the P input is near the M input level, the P-FET MP10 and MP11 conduct a conversion current, and then a bias current of the buffer circuit is increased for enhancement drivability.

The above embodiments apply a MOS FET however other kind of active element is alternative such as a thin film transistor, a GaAs transistor or a bipolar transistor.

Figure 24:
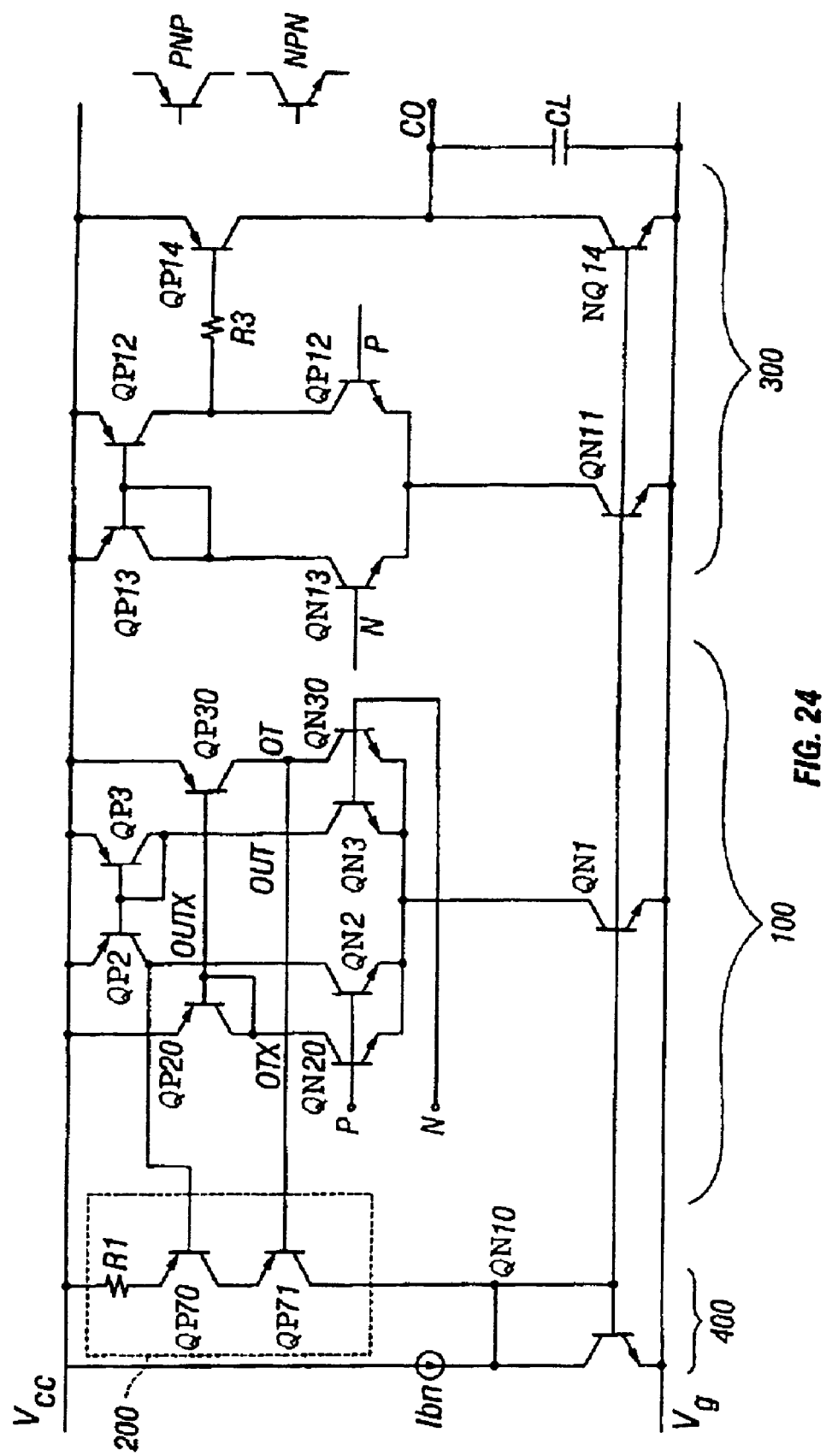
FIG. 24 is a circuit diagram showing a fifth embodiment of the present invention.

FIG. 24 is a circuit diagram of the fifth embodiment designed by bipolar transistor. In the figure, a denose PQ### shows a PNP bipolar transistor, a denote NQ### shows a NPN bipolar transistor. R1 and R2 show resistors.

A sensing circuit 100 consists of two differential pair both of which are connected to a common tail current source. When omitter areas of QP52 and QP63 are designed to smaller size than that of QP53 and QP62 respectively, both of two outputs OUTX and OT turn to lower level than a base-emitter forward voltage Vbe and then the sensing window becomes wider. A conversion circuit 200 is composed of two cascaded transistors QP70 and QP71. A buffer circuit 300 utilizes a conventional NPN input differential amplifier. When the P input is within the sensing window, the conversion circuit 200 generates a conversion current through transistors QP70 and QP71, which is fed back to a bias generating circuit 400 to enhance a drivability of the sensing circuit 100 and the buffer circuit 300.

Figure 25:
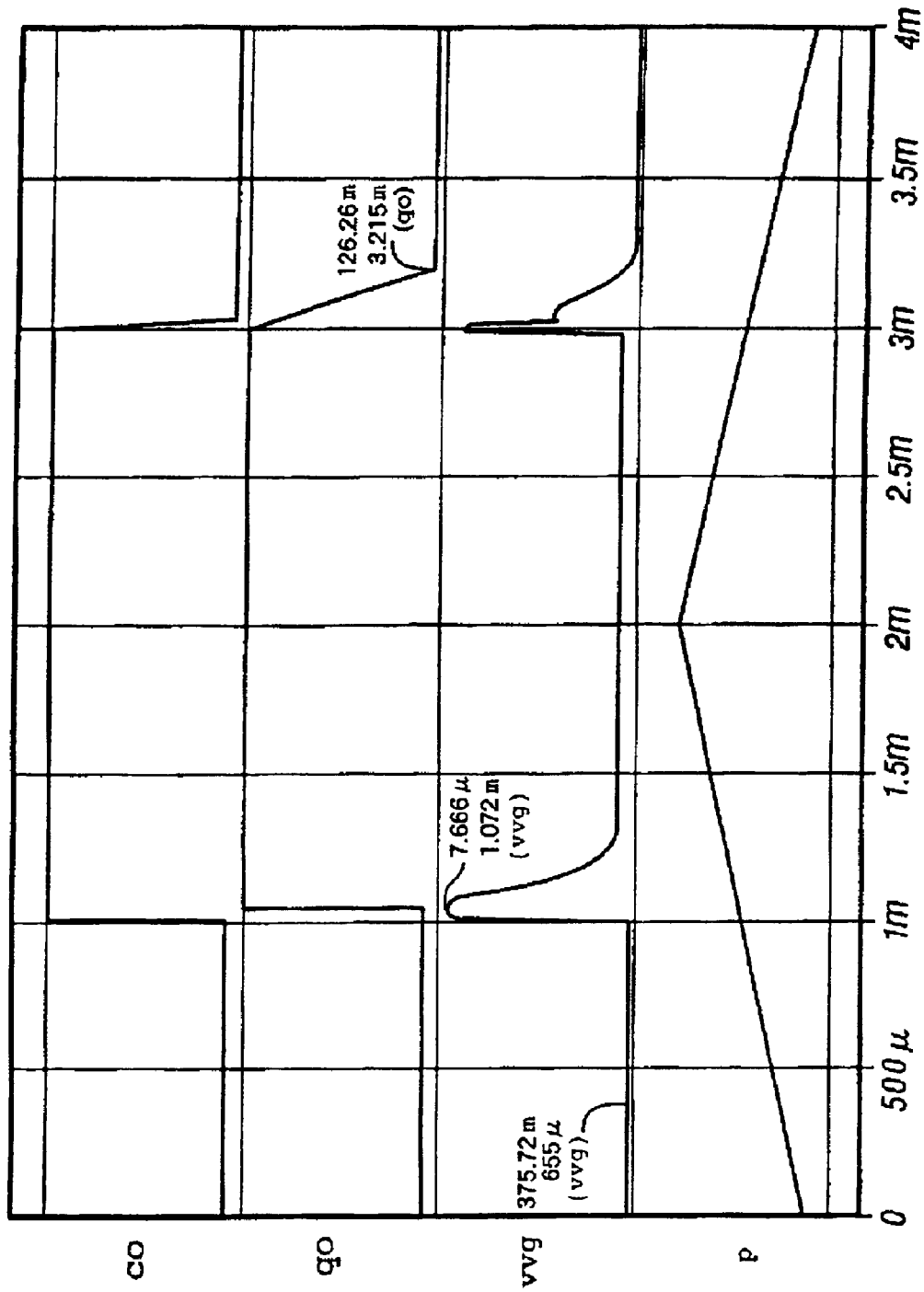
FIG. 25 is a simulation waveform diagram showing voltages and currents of respective node of the circuit showing in FIG. 24.

FIG. 25 is a simulation waveform diagram showing voltages and current in respect to the circuit in FIG 24. In the figure, time scale is plotted on the horizontal axis and the number at pointing line shows that top one is voltage or current and middle one is time.

In case shown FIG. 25, VDD=3V, VSS=0V, CL=5 pF, a constant as VDD/2 is fed to the M input and at the P input terminal a slowly changing triangular signal is fed. A denotation _co_ shows a voltage waveform of the output terminal CO of which rises delay time is 7.6 $\mu$S and fall delay time is 7.2 $\mu$S. A denotation _qo_ shows a voltage waveform of the output terminal CO when the circuit in FIG. 24 has no adaptive feedback path and the rise delay time is 46 $\mu$S and fall delay time is 177 $\mu$S that is fairly larger number than delay time of _co_. A supply current waveform at VSS terminal is denoted by _vvss_ and it indicates peaked current flows at the output transition only, very low current 245 nA flows during the waiting period that is fairly small as a bipolar transistor.

Figure 26:
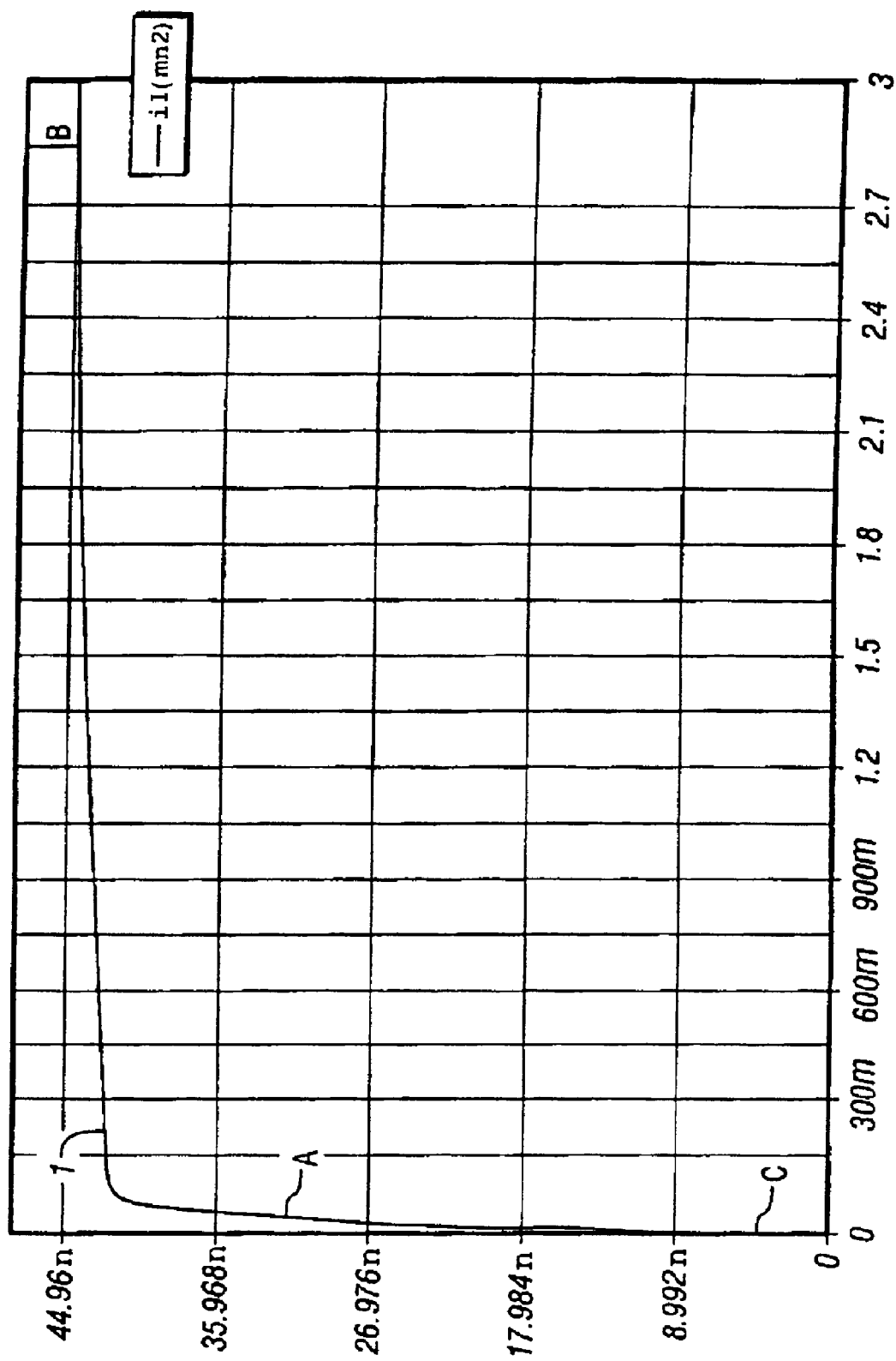
FIG. 26 is a shows transfer characteristics of MN2 and MN3 in FIG. 27 for explaining the operation point.
Figure 27:
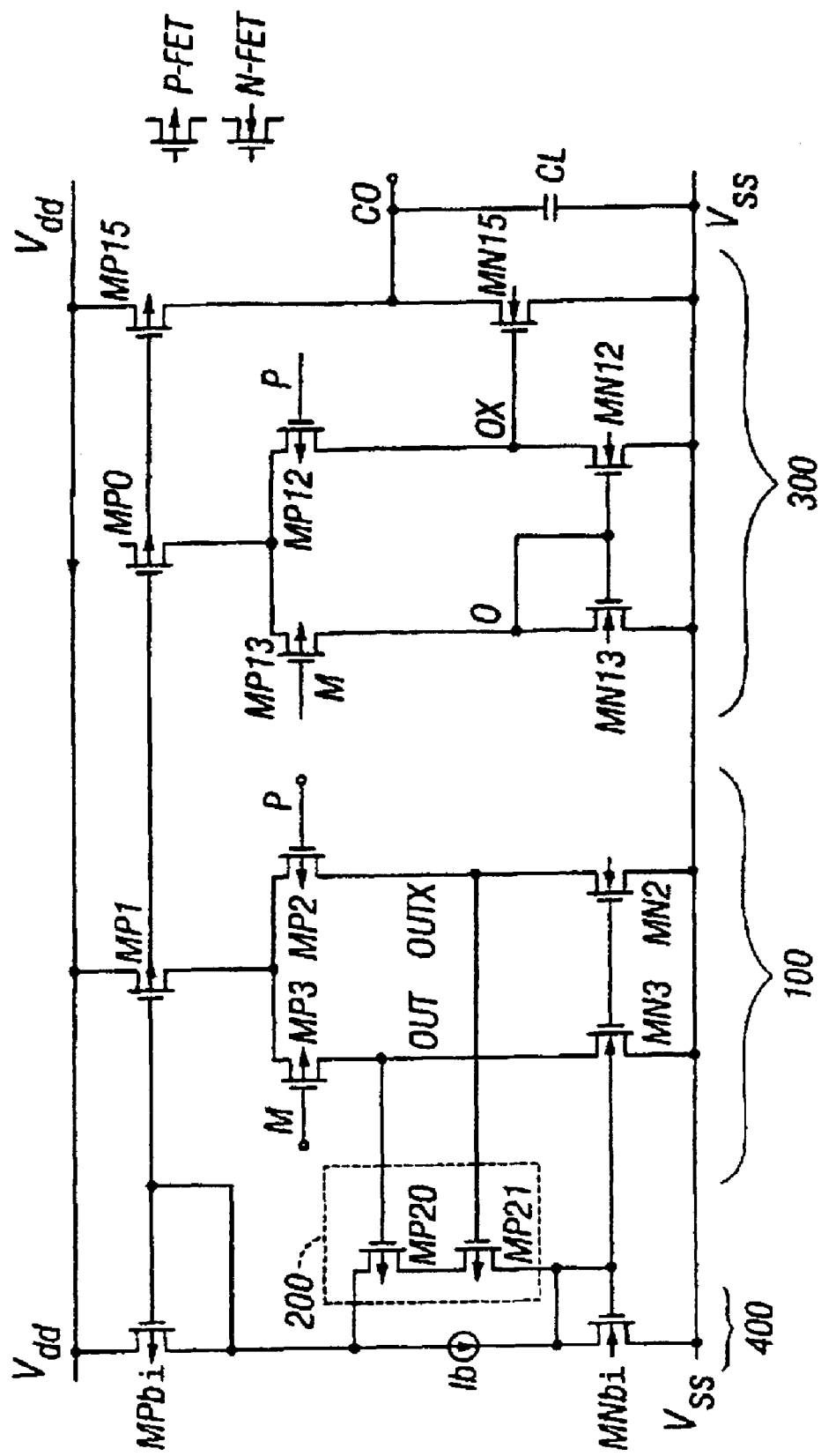
FIG. 27 is a circuit diagram showing a sixth embodiment of the present invention.

FIG. 27 is a circuit diagram showing the sixth embodiment of the presented invention. In the invention, one of significant claimed circuit is a sensing circuit of which outputs turn to lower or higher than a predetermined threshold voltage at the same time. The sensing circuit 100 in FIG. 27 belongs to a different type from previous examples in respect to operation principal, of which sensing window is generated by a combination of FET size and a bias current. The sensing circuit 100 consists of P-FET MP1, MP2 and MP3, and N-FET MN2 and MN3. A differential circuit with constant current loads is cited in U.S. Pat. No. 4,843,341 and U.S. Pat. No. 5,583,425 in a different application from the presented invention. Since a detailed principle of behavior is not described in the referenced patent document, a condition that two outputs turn to low at a same time is analyzed. FIG. 26 is a transfer characteristic diagram for explaining that two outputs turn to low at a same time. In the figure, the curve 1 shows a drain current vs drain voltage is fixed to a constant level.

When the P input and the M input are connected to same voltage level, the same current flows through MN2 and MN3, where the drain current of MN2 and MN3 is limited under the saturation current level, for example ⅔ of that, a operation point of MN2 is located at the A point in the figure, and that means both of drain voltages of MN2 and MN3 are low level. A saturation-current is subjected to a transistor size and a gate potential then it is possible to make two outputs low at the same time by adjusting them. The half width of a window where two outputs turn to low at the same time is calculated from EQ (15) because gate voltage of MP2 and MP3 controls drain current of MN2 and MN3 in a similar way as mentioned previously.

When the P input turns to higher level than the M input, a current of MN2 decreases to keep a low level at the drain output and on the contrary a current of MN3 increases to raise the drain output of MN3. An operation of MN3 increases to raise the drain output of MN3. An operation point of MN2 and MN3 move to C and B point respectively in the figure.

The width of sensing window can be subjected to the size of transistors and the drain current. The larger size the wider window, and MN2 and MN3 can be fixed independently to get asymmetrical window. When an idling current is lessen by limiting the bias tall current, the sensing window become wider. For a smaller size of MN2 and MN3, there is a limitation because a voltage gap between source drain of MP2 or MP3 becomes zero that result in null function of FET when the potential of OUT and OUTX reach to a voltage of tail node.

In the embodiment a P-FET input differential circuit is applied however a N-FET input type is also alternative.

In FIG. 27 one of conversion circuit 201 consists of MP20 and MP21 and R1 controls a sensing circuit 100 and the buffer circuit 300 through a bias current generation circuit 400.

Figure 28:
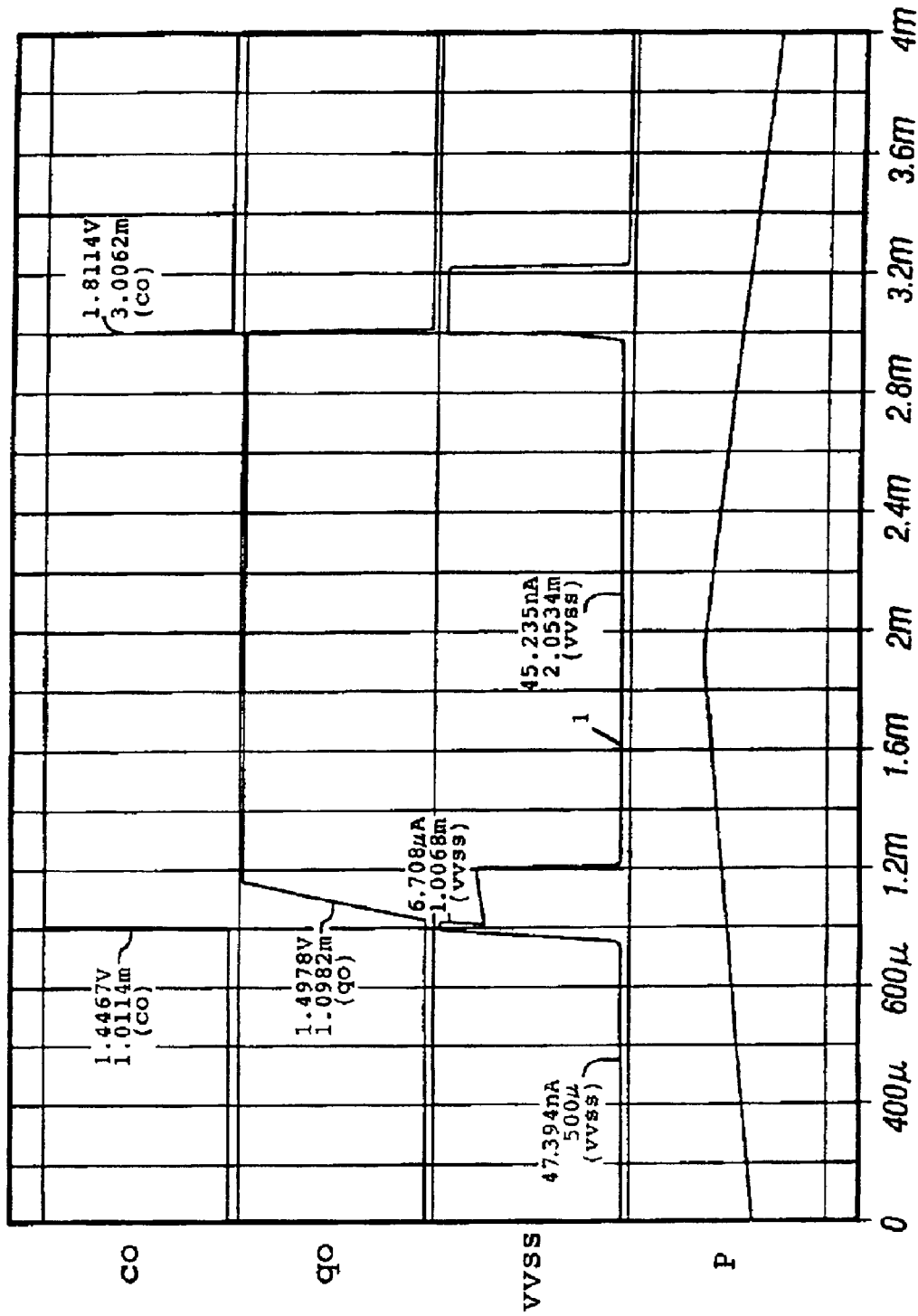
FIG. 28 is a simulation waveform diagram showing voltages and currents of respective node of the circuit showing in FIG. 27.

FIG. 28 is a simulation waveform diagram showing voltages and current in respect to the circuit in FIG. 27. In the figure, time scale is plotted on the horizontal axis and the number at pointing line shows that top one is voltage or current and middle one is time.

In case shown FIG. 20, VDD=3V, VSS=0V, CL=5 pF, a constant voltage as VDD/2 is fed to the M input and at the P input terminal a slowly changing triangular signal is fed.

The voltage waveform of the output terminal CO is shown by _co_, of which transition delay time at rise and fall are 11.4 $\mu$S and 7.2 $\mu$S. The mark _go3_ shows the voltage waveform of the output terminal CO when the circuit in FIG. 17 has no adaptive feedback path and the transition delay time at rise and fall are 98.2 $\mu$S and 177 $\mu$S that are fairly larger number than the delay time of _co_. The supply current waveform at VSS is shown by _vvss_ and that indicates peaked current flow at the output transition only, very low current 45 nA flows during the waiting period.

Figure 29:
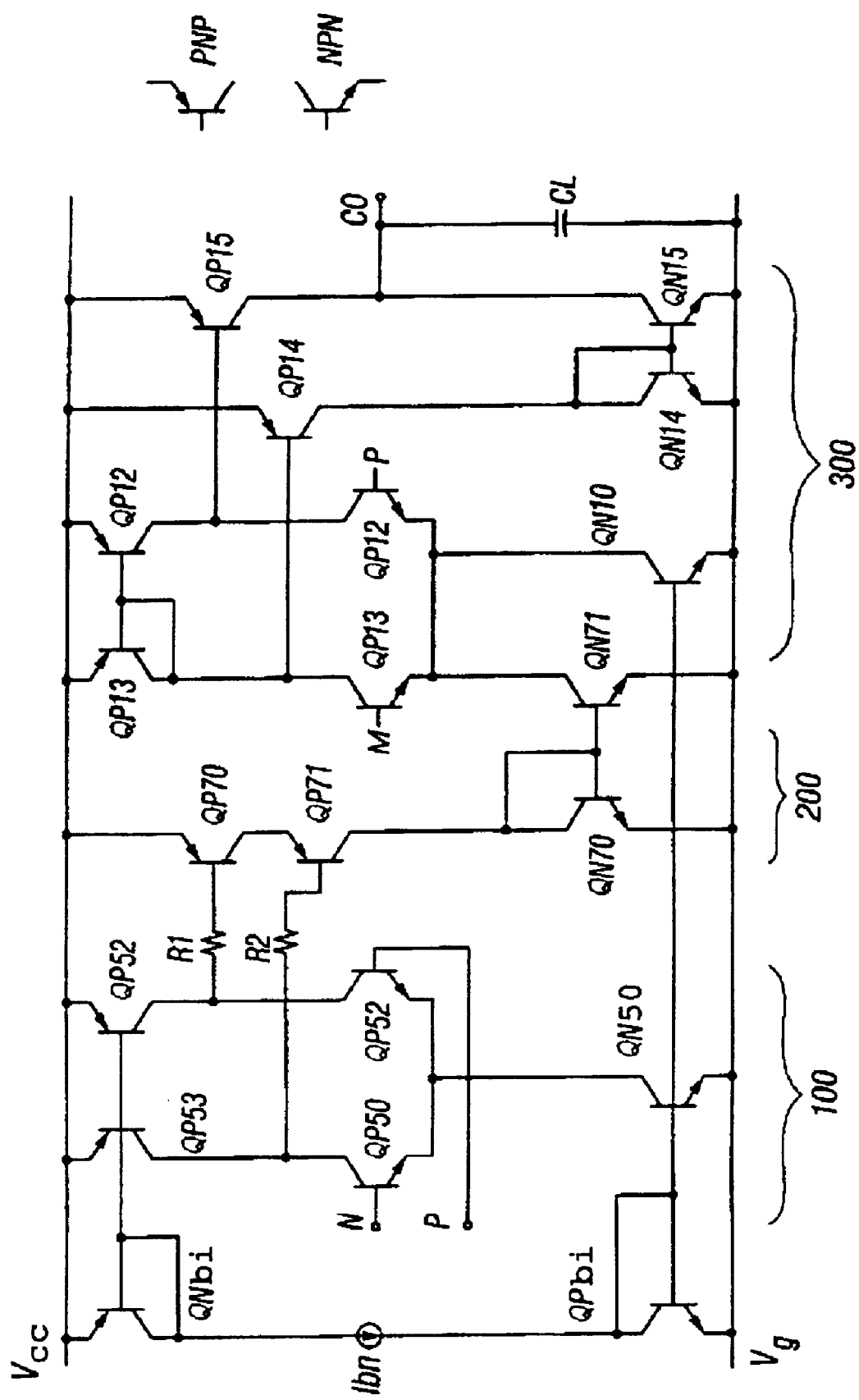
FIG. 29 is a circuit diagram showing a seventh embodiment of the present invention.

FIG. 29 is a circuit diagram showing the seventh embodiment designed by bipolar transistor.

A sensing circuit 100 consists of a NPN input differential circuit with constant current PNP loads. A conversion circuit 200 consists of cascaded PNP transistors, resisters and NPN current mirror transistor and provides a buffer circuit 300 a current feedback.

Figure 30:
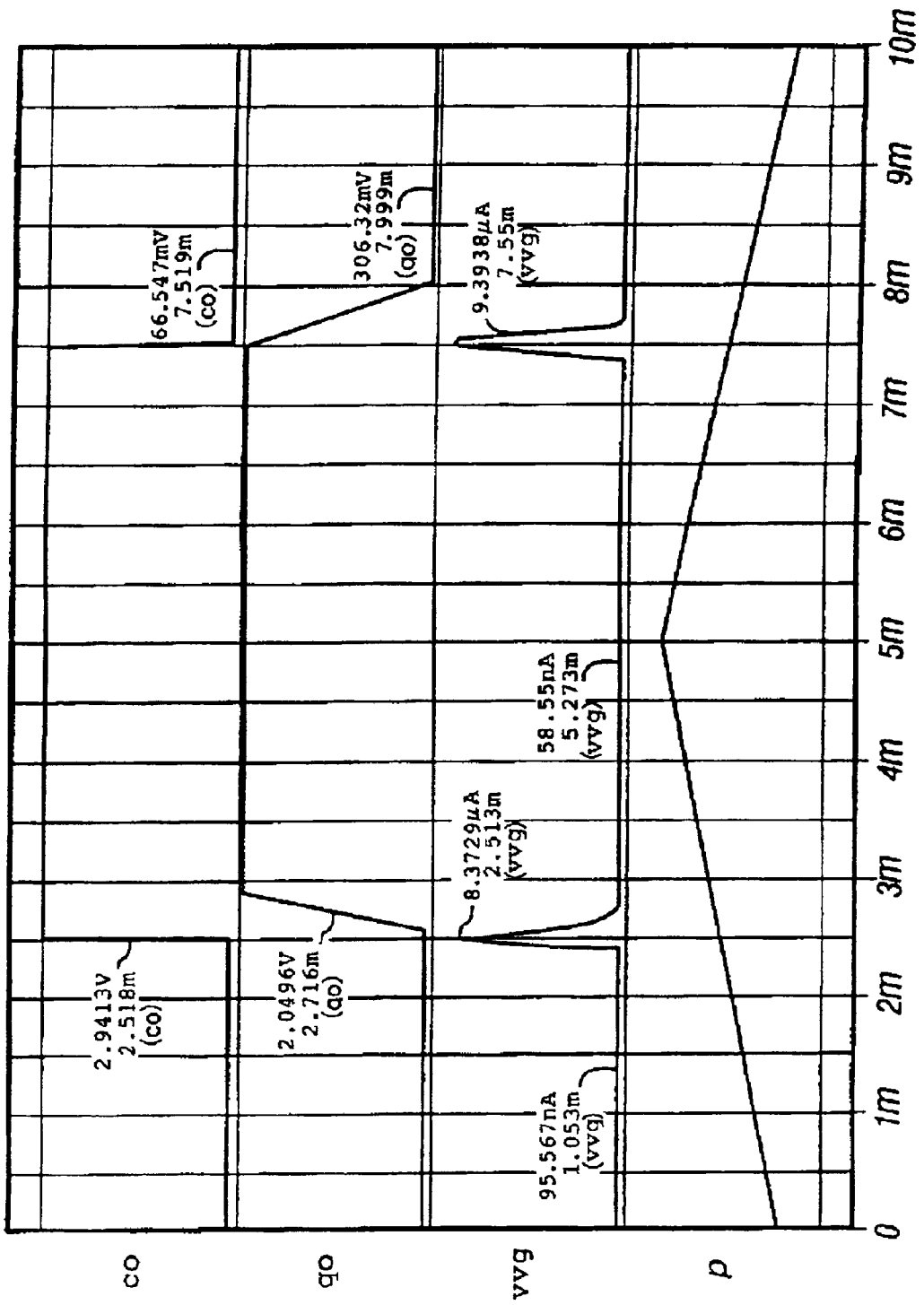
FIG. 30 is a simulation waveform diagram showing voltages and currents of respective node of the circuit showing in FIG. 29.

FIG. 30 is a simulation waveform diagram showing voltages and current in respect to circuit in FIG. 29. A denotation _co_ shows a voltage waveform of the output terminal CO of which rise delay time is 18 $\mu$S and fall delay time is 19 $\mu$S. A denotation _go_ shows a voltage waveform of the output terminal CO when the circuit in FIG. 29 has no adaptive feedback path and the rise delay time in 132 $\mu$S and fall delay time is 511 $\mu$S that is fairly larger number than the delay time of _co_. A supply current waveform at VG terminal is shown by a mark _vvg_ and it indicates peaked current flows at the output transition only, very low current 95 nA flows during waiting period that is fairly small as a bipolar transistor circuit.

Figure 31:
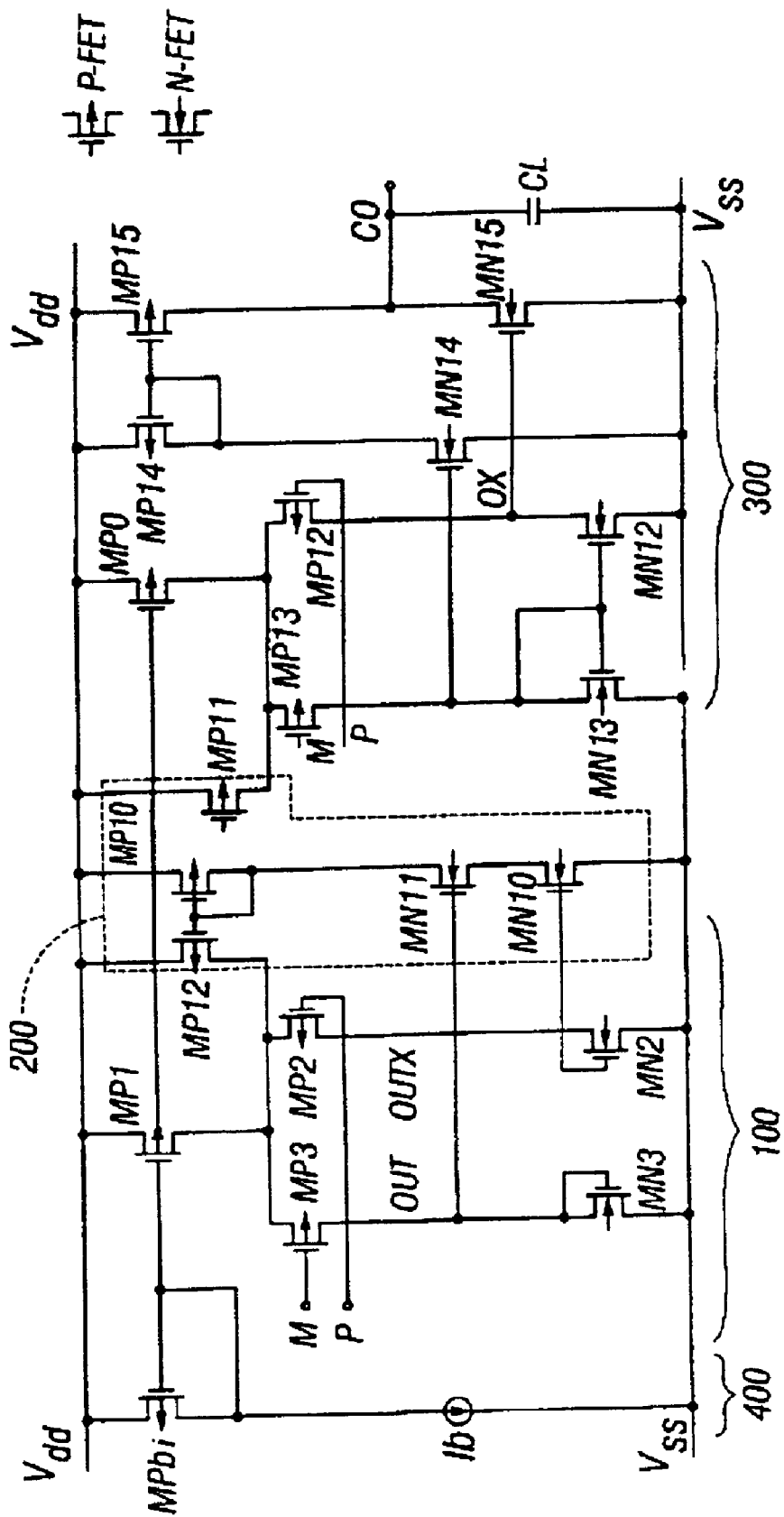
FIG. 31 is a circuit diagram showing a eighth embodiment of the present invention.

FIG. 31 is a circuit diagram showing the eighth embodiment of the invention.

In the figure the circuit is composed of a sensing circuit 100, a conversion circuit 200, a buffer circuit 300 and a bias generator circuit 400.

The sensing circuit 100 consists of a P-FET input differential circuit with diode connection FET loads, MN2 and MN3 are NMOS-FET of which gates are connected to drains to form diodes. Cascaded N-FET MN10 and MN11 in the conversion circuit-200 form a current mirror between MN2 and MN3 and generate a bias feedback current by current to current conversion. MP9, MP10 and MP11 also compose the conversion circuit and amplify the current of MN10 and MN11 to return a feedback to the sensing circuit 100 and the buffer circuit 300.

Figure 32:
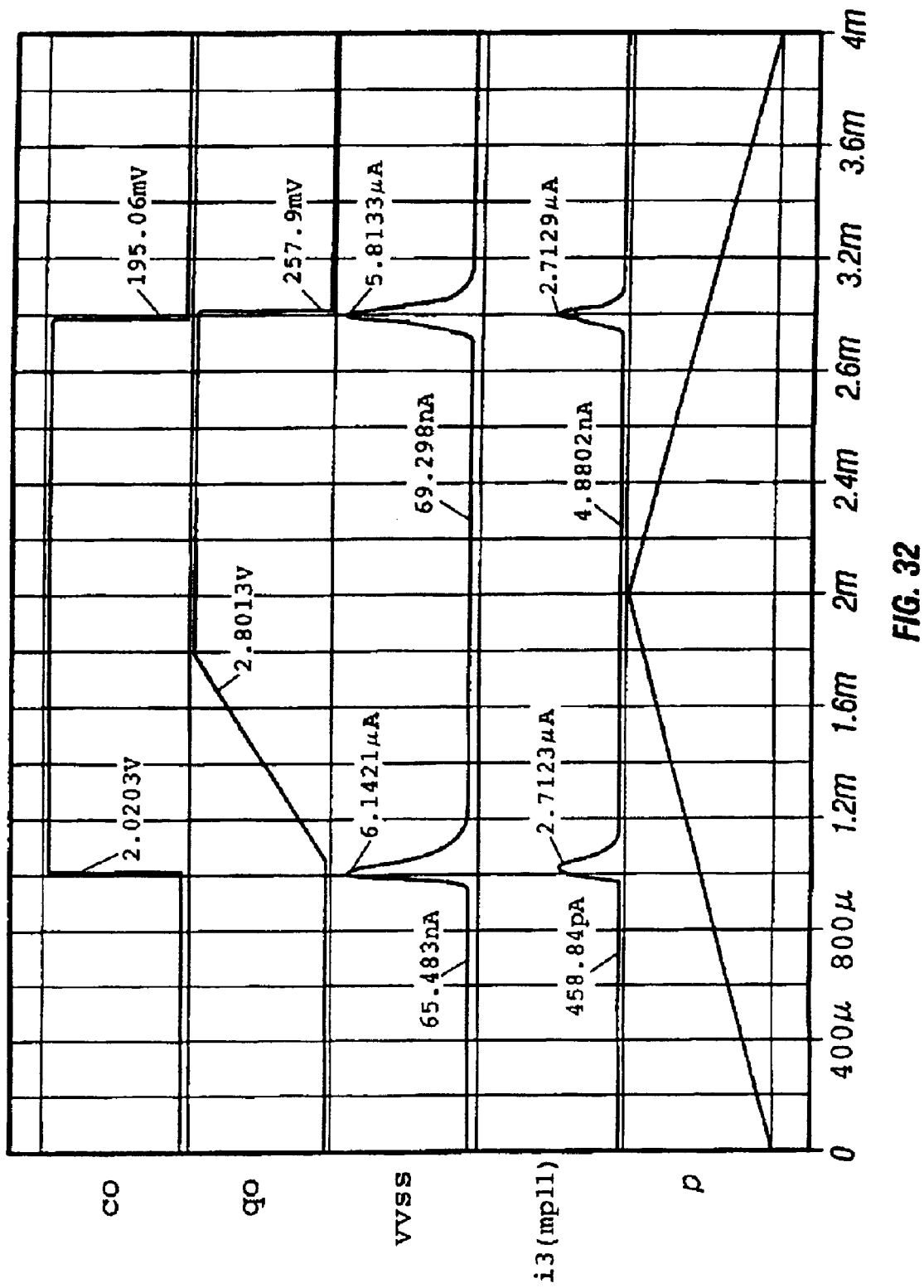
FIG. 32 is a simulation waveform diagram showing voltages and currents of respective node of the circuit showing if FIG. 31.

FIG. 32 is a simulation waveform diagram showing voltages and currents in respect to circuit in FIG. 31. A denotation _co_ shows a voltage waveform of the output terminal CO of which rise delay time is 9.8 $\mu$S and fall delay time is 4.4 $\mu$S. A mark _go_ shows a voltage waveform of the output terminal CO when the circuit in FIG. 29 has no adaptive feedback path and a rise delay time in 429 $\mu$S and a fall delay time is 46.2 $\mu$S that are fairly larger number than delay time of _co_. A supply current waveform at VSS terminal shown by _vvss_ and it indicates peaked current flows at the output transition only, very low current 72 nA flows during waiting period. _i3 (mp10)_ shows drain current waveform at drain terminal of MP10 and it indicates peaked current flows at the output transition only as 2.7 $\mu$A, current 6.7 nA flows during waiting period.

While the presented invention has been commented on the selected embodiment, it will be manifest to be applicable and modified in various ways. It is also apparent that different transistor type and different supply voltages application is feasible.

I claim:

1. An adaptively controlled circuit comprising:
   an output buffer circuit having inputs and outputs and a bias control input:
   a sensing circuit having inputs and outputs of which two or more outputs turn to lower or higher level than a predetermined threshold level at the same time;
   a current conversion circuit composed of one or more set of cascaded transistors, of which inputs are connected to outputs of the sensing circuit and the output is connected to foresaid bias control input of the output buffer, wherein a output current of the current conversion circuit increases when signal level of the inputs of the sensing circuit become equal or close each other;

wherein the sensing circuit has two or more differential pair transistors and having a voltage or current width as W sensing window and a response time T(second), and for a transition rate Vc(Volt or ampere/second) of foresaid input of differential pair transistors, in order to realize a relationship W>Vc*T two of the transistor in foresaid differential pair transistors have different conductance to each other.

2. An adaptively controlled circuit comprising:

a sensing circuit having inputs and outputs and a bias control input, of which two or more outputs turn to lower or higher level than a predetermined threshold level at the same time;

a current conversion circuit composed of one or more set of cascaded transistors, of which inputs are connected to outputs of the sensing circuit and the output is connected to foresaid bias control input of the sensing circuit, wherein a output current of the current conversion circuit increases when signal level of the inputs of the sensing circuit become equal or close each other;

wherein the sensing circuit has two or more differential pair transistors and having a voltage or current width as W sensing window and a response time T(second), and for a transition rate Vc(Volt or ampere/second) of foresaid input of differential pair transistors, in order to realize a relationship W>Vc*T two of the transistor in foresaid differential pair transistors have different conductance to each other.

3. An adaptively controlled circuit comprising:

an output buffer circuit having inputs and outputs and a bias control input;

a sensing circuit having inputs and outputs and a bias control input, of which two or more outputs turn to lower or higher level than a predetermined threshold level at the same time;

a current conversion circuit composed of one or more set of cascaded transistors, of which inputs are connected to outputs of the sensing circuit and one of output is connected to foresaid bias control input of the output buffer, and other output is connected to the bias control input of the sensing circuit, wherein output current of the current conversion circuit increases when signal level of the inputs of the sensing circuit become equal or close each other;

wherein the sensing circuit has two or more differential pair transistors and having a voltage or current width as W sensing window and a response time T(second), and for a transition rate Vc(Volt or ampere/second) of foresaid input of differential pair transistors, in order to realize a relationship W>Vc*T two of the transistor in foresaid differential pair transistors have different conductance to each other.

4. An adaptively controlled circuit comprising:

an output buffer circuit having inputs and outputs a bias control input;

a sensing circuit having inputs and outputs and a bias control input, of which two or more outputs turn to lower or higher level than a predetermined threshold level at the same time;

a bias current generation circuit having one current mirror output at least, which is connected to said bias control input of the sensing circuit and/or the buffer circuit, a current conversion circuit composed of one or more set of cascaded transistors, of which inputs are connected to the outputs of the sensing circuit and one of output is connected to foresaid bias current generation circuit, wherein output current of the current conversion circuit increases when signal level of the inputs of the sensing circuit become equal or close each other;

wherein the sensing circuit has two or more differential pair transistors and having a voltage or current width as W sensing window and a response time T(second), and for a transition rate Vc(Volt or ampere/second) of foresaid input of differential pair transistors, in order to realize a relationship W>Vc*T two of the transistor in foresaid differential pair transistors have different conductance to each other.

* * * * *